United States Patent [19]
Enck et al.

[11] Patent Number: 6,017,485
[45] Date of Patent: *Jan. 25, 2000

[54] PROCESS FOR MAKING A LOW ELECTRICAL RESISTIVITY, HIGH PURITY ALUMINUM NITRIDE ELECTROSTATIC CHUCK

[75] Inventors: Rudolph C. Enck, Phoenix; Jonathan H. Harris, Scottsdale; Robert A. Youngman, Paradise Valley; Thomas S. Nemecek, Tempe, all of Ariz.

[73] Assignee: Carborundum Corporation, Phoenix, Ariz.

[*] Notice: This patent issued on a continued prosecution application filed under 37 CFR 1.53(d), and is subject to the twenty year patent term provisions of 35 U.S.C. 154(a)(2).

[21] Appl. No.: 08/622,994

[22] Filed: Mar. 28, 1996

[51] Int. Cl.$^7$ ................................................ C04B 35/582
[52] U.S. Cl. .................... 264/618; 264/614; 264/647; 264/653; 264/662; 264/664; 264/666; 264/676; 264/663
[58] Field of Search ........................ 264/647, 653, 264/662, 663, 664, 666, 614, 618, 676

[56] References Cited

U.S. PATENT DOCUMENTS

| | | | |
|---|---|---|---|
| 4,331,737 | 5/1982 | Nishizawa et al. | 428/457 |
| 4,416,952 | 11/1983 | Nishizawa et al. | 428/698 |
| 4,547,471 | 10/1985 | Huseby et al. | 501/98 |
| 4,618,592 | 10/1986 | Kuramoto et al. | 501/96 |

(List continued on next page.)

FOREIGN PATENT DOCUMENTS

| | | |
|---|---|---|
| 3-032364 | 4/1982 | Denmark . |
| 0266277 | 4/1988 | European Pat. Off. . |
| 266277 | 5/1988 | European Pat. Off. . |
| 771772 | 5/1997 | European Pat. Off. ...... C04B 35/581 |
| 52-125506 | 10/1977 | Japan . |
| 59-111978 | 6/1984 | Japan . |
| 60-180964 | 9/1985 | Japan . |
| 61-286266 | 12/1986 | Japan . |
| 63-162568 | 7/1988 | Japan . |
| 1-028280 | 1/1989 | Japan . |
| 4-144967 | 5/1992 | Japan . |
| 4-243963 | 9/1992 | Japan . |
| 4-275981 | 10/1992 | Japan . |
| 5-053115 | 3/1993 | Japan . |
| 5-58443 | 3/1993 | Japan . |
| 384921 | 10/1973 | U.S.S.R. . |
| 2202045 | 9/1988 | United Kingdom . |

OTHER PUBLICATIONS

"Properties of High–Density Ceramics from AlN" by Poluboyarinov et al., *Izv. Akad. Nauk SSSR Neorg. Mater.*, vol. 15(11), 1979, pp. 2055–2060 (Abstract).

"Aluminum Oxynitride Spinel (ALON)—A New Optical Window Material" by Hartnett et. al., *Ceram. Eng. Sci. Proc.*, vol. 3 [N 1–2], 1982, pp. 67–76 (Abstract).

(List continued on next page.)

*Primary Examiner*—James Derrington
*Attorney, Agent, or Firm*—Thomas M. DiMauro

[57] ABSTRACT

A controlled dielectric loss, sintered aluminum nitride body having a density of greater than about 95% theoretical, a thermal conductivity of greater than about 100 W/m-K, and a dissipation factor measured at room temperature at about 1 KHz selected from:

(a) less than or equal to about 0.001; and
(b) greater than or equal to about 0.01.

A process for producing a controlled dielectric loss, sintered aluminum nitride body, comprising heat treating an aluminum nitride body at sintering temperatures, including providing a heat treatment atmosphere which effects a selected nitrogen vacancy population in the aluminum nitride body at the sintering temperatures, and cooling the aluminum nitride body from sintering temperatures at a controlled rate and in a cooling atmosphere effective to control the selected nitrogen vacancy population.

10 Claims, 12 Drawing Sheets

U.S. PATENT DOCUMENTS

| | | | |
|---|---|---|---|
| 4,775,596 | 10/1988 | Holleram et al. | 428/432 |
| 4,778,778 | 10/1988 | Mallia et al. | 501/96 |
| 4,783,368 | 11/1988 | Yamamoto et al. | 428/408 |
| 4,796,077 | 1/1989 | Takeda et al. | 357/67 |
| 4,897,372 | 1/1990 | Huseby et al. | 501/96 |
| 4,960,734 | 10/1990 | Kanai et al. | 501/98 |
| 4,997,798 | 3/1991 | Okuno | 264/666 |
| 5,024,975 | 6/1991 | Hartmann | 501/65 |
| 5,034,357 | 7/1991 | Yamakawa et al. | 501/96 |
| 5,070,046 | 12/1991 | Hu | 501/9 |
| 5,079,194 | 1/1992 | Jean et al. | 501/17 |
| 5,085,923 | 2/1992 | Yamakawa et al. | 428/209 |
| 5,141,899 | 8/1992 | Gupta et al. | 501/18 |
| 5,147,484 | 9/1992 | Chance et al. | 156/89 |
| 5,196,381 | 3/1993 | Hu et al. | 501/10 |
| 5,320,990 | 6/1994 | Guiton et al. | 501/98 |
| 5,413,360 | 5/1995 | Atari et al. | 279/128 |
| 5,541,145 | 7/1996 | Harris et al. | 501/96 |
| 5,728,635 | 3/1998 | Kobayashi et al. | 501/98.4 |
| 5,767,027 | 6/1998 | Sakon et al. | 501/98.4 |

OTHER PUBLICATIONS

"Influence of Porosity on the Dielectric Properties of AlN in the Range of 30–40 GHz" by Heidinger et al., *Powder Mattall. Int.*, vol. 20(6), 1988, pp. 30–32 (Abstract).

"Microstructure Development in Sintered Aluminum Nitride" by Brandeau et al., *Sci. Ceram.*, vol. 14., 1988, pp. 413–418 (Abstract).

"Ceramic Substrates and Packages for Electronic Applications", Yan et al., *Advances in Ceramics*, vol. 26, 1989, pp. xi, 608 (Abstract).

"Effect of Various Oxide Additives on Dielectric Behavior of Hot–Pressed AlN Ceramic", by Zulfequar et al., *Mater. Sci. Technol.*, vol. 5(4), 1989, pp. 403–405 (Abstract).

"Development of Mid–Mhz Range, High–Temperature Ultrasonic Transducers with AlN Elements", by Patel et al., *Ceram. Trans.*, vol. 11, 1990, pp. 19–34 (Abstract).

"High Flexural Strength Glass–Ceramic Substance for Multilayer Circuit Board", by Sunahara et al., *Ceram. Trans.*, vol. 8., 1990, pp. 278–291 (Abstract).

"Dielectric Behavior of Hot–Pressed AlN Ceramic Exposed to Inorganic Acid Vapors", by Srivastava et al., *J. Mater. Sci.*, vol. 25(6), 1990, pp. 2861–2865 (Abstract).

"Dielectric Behavior of Hot–Pressed AlN Ceramic Exposed to Organic Acid Vapors", by Srivastava et al., *Mater. Sci. Technol.*, vol. 6(2), 1990, 137–140 (Abstract).

"Laser Deposition of AlN Thin Films on InP and GaAs", by Bhattacharya et al., *Jpn. J. Appl. Phys., Part 2*, vol. 30(10A), 1991, pp.1750–1752 (Abstract).

"Ceramic and Glass–Ceramic Packaging in the 1990's", by Turmmala, *J. Am. Ceram. Soc.*, vol. 74(5), 1991, pp. 895–908 (Abstract).

Kasori et al, Effects of Transition–Metal Additions on the Properties of AlN, J. Am. Ceram. Soc. 77[8] 1991–2000 (1994).

ASTM D 149–93a, Standard Test Method for Dielectric Breakdown Voltage and Dielectric Strength of Solid Electrical Insulating Materials at Commercial Power Frequencies, (1994).

ASTM D 150–92, Standard Test Methods for A–C Loss Characteristics and Permittivity (Dielectric Constant) of Solid Electrical Insulating Materials (1992).

Srivastava et al, Dielectric behavior of hot pressed AlN ceramic exposed to organic acid vapors, Materials Science and Technology, Feb. 1990, vol. 6.

Enck et al, High Thermal Conductivity Substrate Materials, Proceedings of the Technical Program, Nepcon West '90, Cahners Exposition Group, Des Plaines, IL, pp. 1153–1161 (1990).

The Engineering Index Annval, pp. 1750–1752 (1991).

Harris et al, Dielectric Properties of Sintered AlN, Advanced Electronic Packaging materials, Mat. Res. Symp. Proc., vol. 167, Materials Research Soc., Pitts, PA, 1990, pp. 229–234.

Patel et al, Development of MID–MHZ Range, High–Temperature Ultrasonic Transducers with AlN Elements, Ceramic Thin and Thick Films.

Heidinger et al, Influence of Porosity on the Dielectric Properties of AlN in the RAnge of 30 . . . 40 GHz, Powder Metallurgy, vol. 20, No. 6, 1988.

Prohaska et al, Aluminum Nitride: A Review of the Knowledge Base for Physical Preperty Development, Mat. Res. Symp. Symp. Proc. vol. 167, 1990 Materials Research Society.

Komeya et al, Role of $Y_2O_3$ and $SiO_2$ Additions in Sintering of AlN, Journal of the American Ceramic Society, (1974).

Polvoyarinov et al, Properties of High Density Ceramics from AlN (1979) (English Abstract included).

Laurel M. Sheppard, "Aluminum Nitride: A Versatile but Challenging Material", Ceramic Bulletin, vol. 69, No. 11, 1990, pp. 1801–1812.

PROCESS FOR MAKING A LOW ELECTRICAL RESISTIVITY, HIGH PURITY ALUMINUM NITRIDE ELECTROSTATIC CHUCK

TECHNICAL FIELD

The present invention generally relates to sintered aluminum nitride bodies having controlled dielectric properties, such as dielectric loss, dielectric constant and DC resistivity. The present invention is particularly related to sintered aluminum nitride bodies for electronic applications having dielectric properties which are selectively controlled to satisfy their intended electronic application.

BACKGROUND OF THE INVENTION

Dielectric constant, dielectric loss and DC resistivity are critical properties governing the electrical behavior of insulating materials (dielectric materials) utilized in electronic applications, including electronic packaging applications. In many instances, a low dielectric loss material is desirable, because low dielectric loss reduces absorption and distortion of electrical signals traveling throughout the package. However, there are instances where a high dielectric loss insulating material is desirable. Clearly, the ability to vary and control dielectric loss in electronic packaging materials would potentially be of critical importance.

Dielectric Constant (K), the real part of the relative complex permitivity of a material, is the ratio of the capacitance of a given configuration of electrodes with the material as a dielectric to the capacitance of the same electrode configuration with a vacuum (or air for most practical purposes) as the dielectric. For high speed digital circuitry, the dielectric constant is important, because the transmission speed of a pulse in a circuit in contact with the dielectric is inversely proportional to the square root of this quantity. Thus, the lower the dielectric constant, the higher the transmission speed that can be maintained. Dielectric constant also affects crosstalk between adjacent signal lines.

Dielectric loss is electrical energy transformed into heat in a dielectric subjected to a changing electric field. Dielectric loss is usually expressed in terms of loss index or dissipation factor.

Loss Index (K") of a material is the magnitude of the imaginary part of its relative complex permitivity and is proportional to the power dissipated in the material.

Dissipation Factor (D) (tan $\delta$ or loss tangent) is the ratio of the loss index to the dielectric constant (K"/K'). It is also the tangent of the loss angle, $\delta$. The quantity $2 \cdot \omega \cdot D$ (where $\omega$ is the angular frequency of the applied AC field) is the time average power dissipated in a material divided by the time average stored electric energy in that material. Dissipation Factor thus gives a measure of the efficiency by which electric energy may be stored in a material medium, and must be kept low for efficient storage or transmission of energy.

While dielectric constant affects the speed of an electronic signal, dielectric loss affects absorption of the signal. An electronic signal, being a "packet" of frequencies, is subject to selective absorption of given frequencies, resulting in a distortion of the signal. Low loss dielectric materials, thus having a low dissipation factor, will lower the absorption and/or distortion of the signal. For a dielectric material used in a capacitor or resonator, if the material exhibits high dielectric loss, then some of the energy being stored is lost. On the other hand, a high dielectric loss material stabilizes "ringing", that is, reduces voltage oscillation at the leading and trailing edges of rectangular voltage pulses.

Higher dielectric constant materials in graded structures and higher dielectric loss materials are also used at the edges of metallized regions carrying high voltages to reduce voltage gradients and AC corona.

Dielectric loss is typically a strong function of both frequency and temperature. At low frequency (typically less than a few megahertz) and/or high temperature, interfacial polarization effects (caused by charge carriers that are free to move over greater than atomic distances) dominate dielectric loss. At radio frequencies (RF), microwave frequencies and infrared frequencies, dipolar interactions dominate dielectric loss.

Dielectric Strength is the maximum electric field that a dielectric can withstand, without resulting in a voltage breakdown.

A corresponding property is Breakdown Voltage, that is, the voltage necessary to cause the passage of appreciable electric current without a connecting conductor, commonly used to express the voltage at which an insulator fails to withstand the voltage and ceases to behave as an insulator.

Aluminum nitride (AlN) ceramic, particularly in the form of sintered bodies, is an insulator, or dielectric material, that has great potential for electronic applications, particularly electronic packaging. Aluminum nitride in a dense, sintered form possesses a high thermal conductivity, greater than alumina (a conventional, commercial electronic packaging dielectric) and approaching that of beryllia (an electronic packaging dielectric material having toxicity considerations).

Further, aluminum nitride possesses a coefficient of thermal expansion close to that of silicon and gallium arsenide, a high flexural strength, a high hardness, chemical inertness and nontoxic behavior.

Due to its high thermal conductivity, aluminum nitride is usually used in applications where high heat dissipation is required and where the ceramic would be required to operate at elevated temperature. Aluminum nitride substrates are useful where high heat dissipation is required in a microelectronic package, such as in a multilayer metal-ceramic package for high power devices. For example, in microelectronic applications the current required operating temperature ranges from approximately 75 to 200° C. The required temperatures could increase substantially when semiconductors currently under intensive study (such as silicon carbide) come into commercial use.

Aluminum nitride ceramics are also useful for other electronic applications which require heat tolerance and electrical insulating properties. An example would be in electrostatic chucks, where the operating temperature range is 400–500° C.

Prepared from aluminum nitride powders, in order to achieve suitable properties the ceramic must achieve a certain density, at least about 90%, preferably greater than or equal to about 95%, of theoretical. Aluminum nitride decomposes below the temperature required to sinter it to maximum density. However, densification can be achieved at lower temperatures by the use of sintering aids.

Sintering aids liquify at temperatures below the decomposition and pure compound sintering temperatures for the ceramic, and promote densification of the ceramic grains. At the later stages of the liquid sintering cycle, microstructure is refined via grain growth and coalescence processes. Microstructure and grain size can have an effect on dielectric properties.

Sintering aids also function to increase thermal conductivity of the sintered aluminum nitride body by gettering oxygen from the aluminum nitride powder. Thus, an effective sintering additive forms a liquid capable of dissolving and reprecipitating aluminum nitride, without depositing significant amounts of oxygen in the densifying ceramic.

All commercially available aluminum nitride powders contain oxygen as an impurity. This oxygen primarily takes two forms in the powder, as a native alumina coating on each of the powder particles, and as dissolved oxygen impurity within the crystalline lattice of the aluminum nitride particles. A minor amount will be tied up as an oxide of any metal impurities which may be present.

At a given sintering temperature, only a certain amount of oxygen, primarily from native alumina and secondarily from other sources, will be available for reaction (hereinafter "available oxygen"). A certain amount of oxygen will remain bound up in the aluminum-nitrogen crystalline lattice, and thus a true stoichiometric ratio of aluminum to nitrogen is not achieved. The resulting sintered, polycrystalline aluminum nitride exhibits properties, including dielectric properties, which deviate from those which would be exhibited by pure, single crystal AlN.

Sintering aids for AlN which have been disclosed in the art include Group IIa, Group IIIa, and/or rare earth compounds, including calcia and yttria, among others. Resulting AlN sintered bodies are disclosed to also contain second phase materials, including alkaline earth-aluminates, Group IIIa-aluminates, rare earth-aluminates, ternary oxides of aluminum and at least two sintering aid metals, and AlON.

U.S. Pat. No. 4,618,592 discloses the use of sintering aids for aluminum nitride which are at least one metal element selected from alkaline earth metals, lanthanum group metals and yttrium or a compound thereof. The patent further discloses that bound oxygen and impurity content affect the light transmitting property of the resulting sintered body, and that preferably, the bound oxygen content is at most 1.5% by weight.

Conventional aluminum nitride ceramics possess a dielectric constant of between 8.4 and 9 as compared to 10.1 for alumina, and a dissipation factor, measured at room temperature at a frequency of 1 KHz, of between 0.001 and 0.01. These materials typically have been reported to have a direct current (DC) electrical resistivity of $10^{14}$ ohm-cm. Heretofore, it has not been known what functionality within the AlN controls the dielectric loss and DC resistance.

Dielectric properties of aluminum nitride materials have been modified by the addition of different materials to the ceramic, such as transition metal addition as reported in Kasori et al. "Effects of Transition Metal Additions on the Properties of AlN" J. Am. Ceram. Soc. 77 [8] 1991–2000 (1994), or blending of dielectric materials as disclosed in U.S. Pat. Nos. 4,796,077 and 4,960,734.

The layering of various insulating and non-insulating materials has also been shown to affect dielectric properties, including dielectric breakdown voltage, as disclosed in U.S. Pat. No. 4,783,368. Aluminum nitride has been disclosed in U.S. Pat. No. 5,070,046 as a ceramic filler for dielectric compositions, such as borosilicate glass and cordierite glass, which exhibit low dielectric constant and low dielectric loss.

U.S. Pat. No. 5,320,990 discloses the development of thermal conductivity of sintered aluminum nitride of greater than 200 W/M-K by sintering aluminum nitride powder and a powdered sintering aid in the presence of nitrogen gas, including heating to the sintering temperature at a rate of greater than 0° C. to about 6° C. per minute, maintaining at the sintering temperature to obtain greater than 95% theoretical density, and cooling the sintered body in a vacuum or an inert gas to 1400° C. at a rate of greater than 0° C. to about 6° C./minute, before cooling to ambient. This document disclosed that a prior art patent, No. 4,778,778, taught the heating of a compacted AlN body at no more than 250° C. per hour and the cooling of the sintered AlN at a rate of no more than 300° C./per hour, preferably 100° C.–275° C./hr.

SUMMARY OF THE INVENTION

We have discovered that the dielectric properties, including DC resistivity, of aluminum nitride can be selectively controlled to produce sintered aluminum nitride bodies having dielectric characteristics which are tailored to the intended use of the aluminum nitride bodies. We have found that selected dielectric properties of sintered aluminum nitride can be effected during the sintering of the aluminum nitride green body, and/or by a post-sintering heat treatment of the aluminum nitride sintered body.

We have found that the nitrogen vacancy population of the aluminum nitride polycrystalline lattice affects the dielectric properties of the sintered aluminum nitride body, such as dielectric constant, dielectric loss, DC resistivity, dielectric strength and breakdown voltage. A nitrogen population, varying from the sintered equilibrium population, can be "quenched" or "frozen" into the sintered body, imparting the desired properties. Therefore, sintered aluminum nitride bodies having a selectively controlled nitrogen vacancy population, characteristic of the desired dielectric properties, can be prepared.

The present invention, therefore, provides a process for producing a controlled dielectric loss, sintered aluminum nitride body, including providing a sintering atmosphere which effects a selected nitrogen vacancy population in the aluminum nitride body at sintering temperatures, and cooling the aluminum nitride body from sintering temperatures at a controlled rate and in a cooling atmosphere effective to control the selected nitrogen vacancy population.

The present invention further provides a controlled dielectric loss sintered aluminum nitride body produced by providing a sintering atmosphere which effects a selected nitrogen vacancy population in the aluminum nitride body at sintering temperatures, and cooling the aluminum nitride body from sintering temperatures at a controlled rate and in a cooling atmosphere effective to control the selected nitrogen vacancy population.

The present invention also provides a process for producing a controlled dielectric loss, sintered aluminum nitride body, including exposing a sintered aluminum nitride body to an atmosphere which effects a selected nitrogen vacancy population in the aluminum nitride body at elevated temperature, and cooling the aluminum nitride body from the elevated temperature at a controlled rate and in a cooling atmosphere effective to control the selected nitrogen vacancy population.

The present invention also provides a controlled dielectric loss sintered aluminum nitride body produced by exposing the sintered aluminum nitride body to an atmosphere which effects a selected nitrogen vacancy population in the aluminum nitride body at elevated temperature, and cooling the aluminum nitride body from the elevated temperature at a controlled rate and in a cooling atmosphere effective to control the selected nitrogen vacancy population.

In general, therefore, the present invention provides a process for producing a controlled dielectric loss, sintered aluminum nitride body, comprising heat treating an aluminum nitride body at sintering temperatures, including providing a heat treatment atmosphere which effects a selected nitrogen vacancy population in the aluminum nitride body at said sintering temperatures, and cooling the aluminum nitride body from said sintering temperatures at a controlled rate and in a cooling atmosphere effective to control the selected nitrogen vacancy population.

In one embodiment, the inventive process includes controlling at least one of said cooling rate to a quench temperature and said cooling atmosphere, to maintain a nitrogen vacancy population below the quench temperature greater than the sintered aluminum nitride body conventional nitrogen vacancy population below said quench temperature.

In another embodiment, the inventive process includes controlling at least one of said cooling rate to a quench temperature and said cooling atmosphere, to reduce the nitrogen vacancy population below the quench temperature to less than the sintered aluminum nitride body conventional nitrogen vacancy population below said quench temperature.

The present invention further provides a controlled dielectric loss, sintered aluminum nitride body having a density of greater than about 95% theoretical, a thermal conductivity of greater than about 100 W/m-K, and a dissipation factor measured at room temperature at about 1 KHz selected from:

(a) less than or equal to about 0.001; and
(b) greater than or equal to about 0.01.

In one embodiment, the present invention provides a high dielectric loss sintered aluminum nitride body, having a dissipation factor measured at room temperature at about 1 KHz of greater than about 0.01, preferably greater than about 0.1.

The present invention further provides a preferred high dielectric loss sintered aluminum nitride body, having a dissipation factor measured at room temperature at about 1 KHz of at least about 0.5.

In another embodiment, the present invention provides a low dielectric loss sintered aluminum nitride body, having a dissipation factor measured at room temperature at about 1 KHz of less than about 0.001, preferably less than about 0.0003.

DETAILED DESCRIPTION OF THE INVENTION

Figure 1:
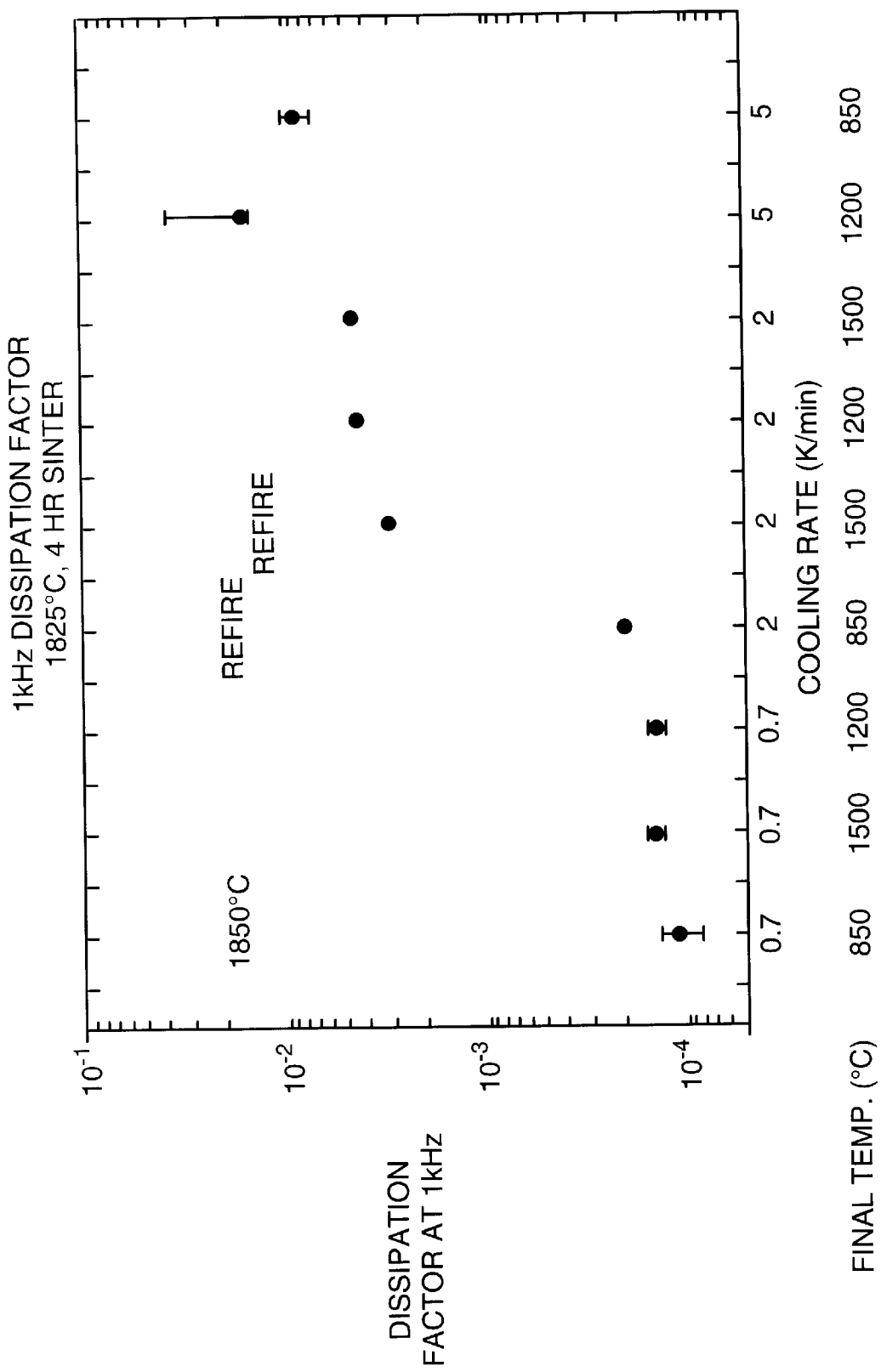
FIG. 1 is a graphical representation of the effect of cooling rate and the low temperature limit of controlled cooling on the dissipation factor of aluminum nitride ceramic.

The present invention is directed to controlled dielectric loss sintered aluminum nitride bodies having a density of greater than about 90% of theoretical, preferably greater than about 95% of theoretical, and having a thermal conductivity greater than about 100 W/mK. Preferably, the controlled dielectric loss sintered aluminum nitride bodies have a density of about 97% theoretical, or greater. When using sintered aluminum bodies less than 95% dense, care must be taken to avoid uptake of water or water vapor, because water can increase dielectric loss.

It is preferred that the sintered aluminum nitride bodies of the present invention contain a discrete second phase. That is, in preparing the sintered bodies using sintering aids, the sintering temperature reaches a maximum prior to either the continuous wetting of the ceramic by the sintering aid or the vaporization of all sintering aid from the sintered body. However, the invention is also applicable to very high thermal conductivity aluminum nitride bodies in which most of the second phase has been removed by extended sintering.

If second phase is present in the sintered aluminum nitride body, it is preferably discontinuous, that is, dewetted from the aluminum nitride grains. The second phase preferably contacts the aluminum nitride grains at a dihedral angle sufficient to provide a microstructure which is discontinuous, preferably providing a resistivity of at least $10^8 \Omega$-cm. In some embodiments the dihedral angle is greater than about 30°, most preferably greater than about 80°.

Components of the mixture which is sintered to form the sintered aluminum nitride polycrystalline body include aluminum nitride powder, preferably having a low oxygen content (such as F-grade sold by Tokuyama Soda an aluminum nitride powder made by a carbo-thermal reduction process which typically has less than 5 ppm iron), a conventional binder used to help form a green body such as polyvinylbutyral (PVB), and at least one sintering aid in an amount effective to remove available oxygen from the aluminum nitride under sintering conditions.

The sintering aid may conventionally comprise at least one of a) at least one element or metal compound of Group IIa, b) at least one element or metal compound of Group IIIa or the rare earths (lanthanides), or c) mixtures of sintering aid components a) and b). The Group IIa, IIIa, or rare earth metal compounds are preferably metal oxides. Alternatively, one or both components are compounds convertible to the metal oxide in the sintering environment and which have no constituents which would be deleterious to the properties desired in the sintered AlN body. The metal oxide must be capable of reacting at a temperature within the sintering regime with alumina from the AlN grains to form a second phase in the sintered body. An example of a suitable metal oxide of Group IIa is calcia and of Group IIIa is yttria.

Group IIa metals that provide the desired second phase and, compounds of which can be used as effective sintering aids in the present invention, include Ca, Sr, Ba and mixtures thereof. Group IIIa or rare earth metals that provide the desired second phase and, compounds of which can be used as effective sintering aids in the present invention, include Y, La, Ce, Nd, Sm, Eu, Gd, Tb, Dy, Ho, Er, Tm, Yb, Lu, and mixtures thereof. Compounds of the above metals which may function as sintering aids for aluminum nitride according to the present invention include but are not limited to oxides, carbonates, nitrates, sulfates, fluorides and mixtures thereof.

According to the present invention, sintered aluminum nitride bodies can be prepared which exhibit a dissipation factor at about 1 KHz and at room temperature of a) greater than 0.01, or b) less than 0.001, compared to conventional aluminum nitride ceramics which exhibit dissipation factors of between 0.001 to 0.01. We have discovered that dielectric loss in aluminum nitride can be selectively controlled by controlling the nitrogen vacancy population within the aluminum-nitrogen polycrystalline lattice.

Conventional sintered aluminum nitride has a characteristic nitrogen vacancy population which is determined by the equilibrium nitrogen vacancy population at a temperature between the sintering temperature and somewhat less than about 1600° C. in a nitrogen containing atmosphere.

We have found that sintered aluminum nitride having a higher nitrogen vacancy population than the conventional nitrogen atmosphere-sintered, room temperature-cooled, equilibrium nitrogen vacancy population, exhibits higher dielectric constant, higher dielectric loss and a higher dissipation factor than does the conventional aluminum nitride having the conventional nitrogen vacancy population. Conversely, we have found that sintered aluminum nitride having a lower nitrogen vacancy population than the conventional sintered population exhibits lower dielectric loss and a lower dissipation factor than does conventional aluminum nitride having the conventional nitrogen vacancy population.

We have further found that, during sintering of the aluminum nitride green body, or in a post sintering heat treatment (refire) of the aluminum nitride sintered body, nitrogen vacancy population is affected by the temperature and the atmosphere to which the aluminum nitride is exposed. Further, the nitrogen vacancy population of a sintered aluminum nitride body is dependent upon the exposure of the body to nitrogen at a temperature high enough to cause transport of nitrogen into or out of the polycrystalline lattice of the body.

During sintering of the aluminum nitride green body, or in a post sintering heat treatment of the aluminum nitride sintered body, the higher the temperature and/or the lower the nitrogen partial pressure to which the aluminum nitride body is exposed, the greater the population of nitrogen vacancies that is formed in the material.

In conventional aluminum nitride processing, which includes sintering in a nitrogen atmosphere followed by a relatively slow cooling procedure, on the order of greater than about 5 K/minute, nitrogen which is driven out of the body is replaced with a thermally aided nitrogen diffusion back into the aluminum-nitrogen lattice. Although there is practically never a stoichiometric 1:1 ratio of aluminum to nitrogen reached because of the presence of residual bound oxygen in the lattice as well as metal ion impurities, in a conventionally sintered and cooled aluminum nitride body, a conventional nitrogen vacancy population characteristic of some nitrogen diffusion-limiting temperature (i.e., less than about 1600° C.) reached during cooling is "frozen in" and results in the conventional range of dielectric loss and dissipation factor for aluminum nitride.

We have also found that selectively controlling the cooling rate and/or cooling atmosphere after sintering or heat treatment of the sintered aluminum nitride body can control the nitrogen vacancy population which is "frozen in" or which remains in the cooled body, to effect the desired dielectric properties of dielectric loss, dissipation factor, dielectric constant and DC resistivity.

For example, during sintering, the higher the sintering temperature that is used, the higher the nitrogen vacancy population that is created at temperature. If the body is cooled or "quenched" rapidly enough, a high nitrogen vacancy population is frozen in the ceramic, characteristic of that temperature below the sintering temperature at which the vacancy population is frozen in, resulting in a high loss dielectric.

If, however, after sintering at that temperature, the body is cooled at a conventional rate, the nitrogen diffuses back into the material until the rate of diffusion becomes too slow, that is, the rate of relaxation of the nitrogen diffusion process becomes lower than the rate of temperature change, and a conventional nitrogen vacancy population is reached.

To achieve very low dielectric loss aluminum nitride, we have slowed the cooling rate from sintering temperature significantly, and thus reached a lower temperature (than is characteristic of conventional aluminum nitride cooling processes) before the nitrogen vacancy population is frozen, or quenched, in the ceramic material. The lower quench temperature has enabled us to achieve a very low nitrogen vacancy population in the aluminum nitride ceramic body, and to produce very low dielectric loss, low dissipation factor aluminum nitride.

In addition to the selective control of dielectric loss during the sintering process, we have found that the dielectric loss properties of a sintered aluminum nitride body can be altered by a post sinter/cool heat treatment. For example, a high or a conventional dielectric loss material can be heat treated to equilibrate with a nitrogen containing atmosphere, followed by a slow cooling procedure in the presence of nitrogen, to be converted to a low dielectric loss material.

Conversely, a low or a conventional dielectric loss material can be heat treated under conditions that will drive nitrogen out of the lattice, such as a low partial pressure of nitrogen atmosphere, an inert gas such as argon, or a vacuum. A fast quench step under similar atmospheric conditions will freeze the resulting nitrogen vacancies in the ceramic to achieve a high dielectric loss material. Similar atmospheric conditions, and a fast quench procedure can selectively produce high dielectric loss aluminum nitride. Even in a nitrogen atmosphere, sufficiently fast cooling from sintering temperatures after heat treatment will result in a high dielectric loss aluminum nitride material.

At the sintering (or refire) temperature, either an equilibrium or nonequilibrium nitrogen vacancy population may exist in the aluminum nitride. For the equilibrium population case (where at least some amount of nitrogen gas must be present in the processing atmosphere), as the body is cooled, the nitrogen vacancy population remains in equilibrium until some lower temperature where it freezes in at approximately the value it will have at room temperature. Depending on the cooling rate either high or low dielectric loss material results, but not as high a dielectric loss material as would be produced in a 100% inert (argon) atmosphere.

The non-equilibrium case is caused either by too low a concentration of nitrogen gas for the processing temperature or by not enough time at the processing temperature. If there is some nitrogen gas in the processing atmosphere, the nitrogen concentration in the aluminum nitride material will increase during cooling until the temperature becomes low enough for that cooling rate to freeze in a nitrogen vacancy population. (Equilibrium may or may not have been reached at some point during cooling.) The resulting aluminum nitride material may be high or low dielectric loss material at room temperature, depending on the nitrogen gas partial pressure and the cooling rate. When a 100% argon atmosphere is used as the cooling atmosphere, a high dielectric loss material should, in principle, result. With slow cooling rates, it is possible that intermediate (normal) dielectric loss values may result, probably due to small levels of nitrogen impurity in the argon gas or to the back pressure of nitrogen diffusing out of the aluminum nitride material.

According to the present invention, low dielectric loss sintered aluminum nitride bodies are produced by sintering the aluminum nitride green body at the sintering temperature permitted by the particular sintering aid present in the green body. For example, when the sintering aid is yttria, the preferred sintering temperature is about 1825° C. to about 1850° C. When sintering is completed, the sintered body is cooled slowly in an atmosphere having a high nitrogen partial pressure, until the quenching temperature is reached, at greater than about 850° C. to less than about 1500° C.

The cooling rate which permits relaxation of the nitrogen diffusion process to restore nitrogen to the aluminum-nitrogen lattice and reduce the nitrogen vacancy population is less than 5 K/minute, preferably less than or equal to about 1–2 K/minute, most preferably less than about 0.75 K/minute. We have achieved sintered aluminum nitride ceramics having a dielectric loss as low as about $1 \times 10^{-3}$ to about $1 \times 10^{-5}$ with this process. FIG. 1 demonstrates the effect of cooling rate on the dissipation factor of aluminum nitride ceramic sintered at 1825° C. to 1850° C. for four hours. Fast cooling to less than 1500° C. resulted in high dielectric loss, high dissipation factor aluminum nitride, while slow cooling to 1500° C. or less resulted in a low dielectric loss, low dissipation factor aluminum nitride.

In addition to controlled cooling rate, the temperature to which the controlled cooling is effected may have an effect on the nitrogen vacancy population of the resulting ceramic. While we have shown that very rapid cooling, on the order of about 15K/min or greater, from the sintering temperature results in a high nitrogen vacancy population, high dielectric loss material, the results of intermediate to slow cooling rates are affected to some degree by the temperature to which the controlled cooling is carried out.

Further with reference to FIG. 1, cooling at 0.7K/min to 1500° C. produced low dielectric loss material, while cooling at that rate to 1600° C. followed by rapid cooling (not shown) produced a high dielectric loss material. Cooling at 2K/min to 1200° C.–1500° C. produced intermediate loss material, while cooling at 2K/min to 850° C. to about 1000° C. produced low dielectric loss material.

The cooling rate need not be maintained at the slow rate throughout the entire temperature range above the quench temperature, but only for a period of time and at a temperature above the quench temperature which permits the nitrogen vacancy population to be reduced by nitrogen diffusion into the lattice. For example, a fast cool-slow cool-fast cool procedure can be used through the quench temperature to achieve the desired effect (provided that the quench occurs during the slow cool period). It is preferred, however, to maintain a slow cooling rate initially until relaxation of the diffusion process is completed, with a subsequent faster drop to ambient in order to save time and energy.

A cooled, sintered aluminum nitride body exhibiting conventional or high dielectric loss can be converted to low dielectric loss according to the present invention by a post-sinter heat treatment followed by the above described slow cool to quench in a nitrogen containing atmosphere until the quench temperature is reached. For example, a sintered high loss aluminum nitride body can be converted to a low loss body by heat treatment at about 1650° C.–1850° C. or higher, preferably about 1725° C.–1850° C., followed by a slow cool in a nitrogen atmosphere until the quench temperature is reached. FIG. 1 also demonstrates the effect of cooling rate on dissipation factor of sintered aluminum nitride heat treated at 1825° C. for 4 hours. Cooling slow to less than 1500° C. after refire resulted in a low dielectric loss, low dissipation factor aluminum nitride.

Figure 2:
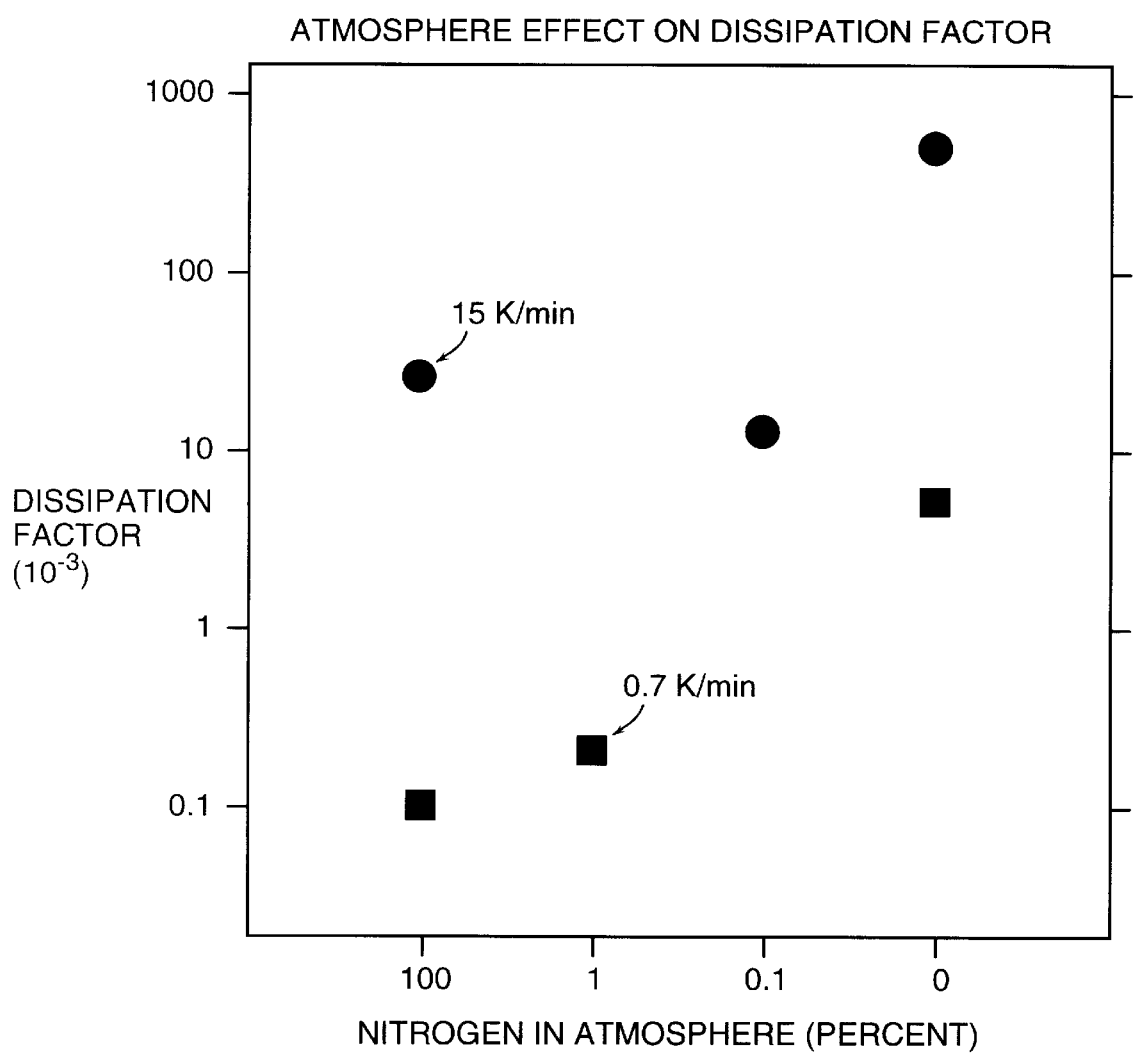
FIG. 2 is a graphical representation of the effect of cooling atmosphere and cooling rate on the dissipation factor of sintered aluminum nitride ceramic.
Figure 3:
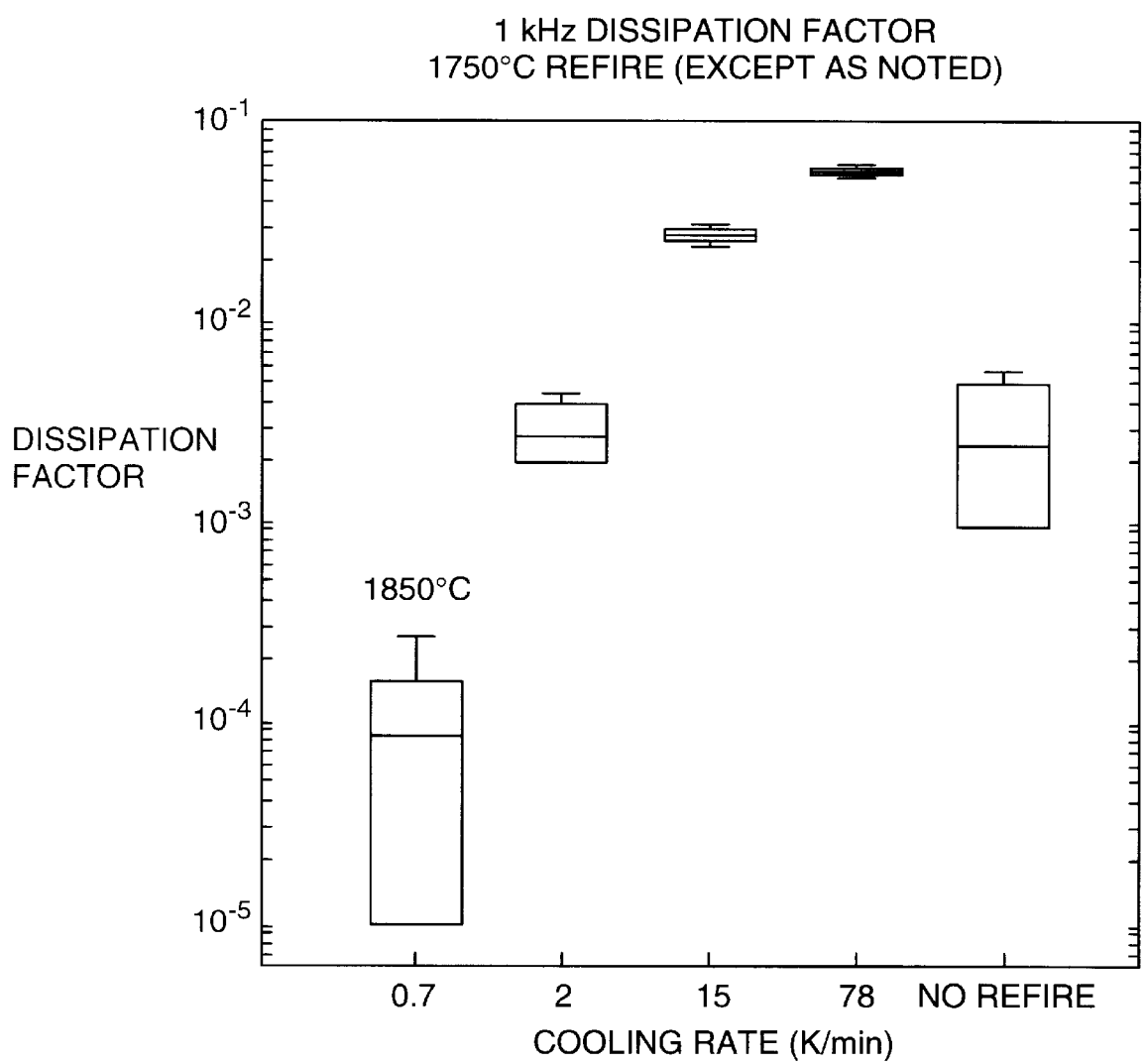
FIG. 3 is a graphical representation of the effect of cooling rate after heat treatment on dissipation factor of sintered aluminum nitride ceramic.

To obtain a high dielectric loss sintered aluminum nitride body, the green body is sintered at a high temperature in a nitrogen containing atmosphere, as sintering in the absence of nitrogen would cause the body to vaporize. After sintering is completed, it is preferable to cool the sintered body in a nitrogen-free atmosphere, such as argon or a similar inert gas, in the temperature range above quench at which the body will not be vaporized, until the quench temperature is reached. The sintered body can also be cooled in a nitrogen containing atmosphere, but at a fast cool rate to prevent diffusion of nitrogen back into the lattice. The cooling rate which would prevent the nitrogen vacancies from being eliminated is greater than or equal to about 5 K/minute, preferably greater than or equal to about 15 K/minute. FIG. 2 demonstrates the effect of atmosphere and cooling rate on the dissipation factor of sintered aluminum nitride ceramic, as reported in Table I for examples 8, 16 and 48 for fast cooling and examples 20, 25 and 49 for slow cooling. Fast cool in 100% nitrogen resulted in a high dissipation factor, while a slow cool in nitrogen resulted in a low dissipation factor. Fast or slow cool in a nitrogen deficient atmosphere resulted in a higher dissipation factor.

As an example, an aluminum nitride green body containing an effective amount of calcium carbonate sintering aid was sintered at about 1700° C. with a slow cool to quench. The resulting sintered body, without the addition of a colorant, exhibited a dielectric loss of $0.6 \times 10^{-3}$, and had a grey color instead of the light tan color of conventional aluminum nitride ceramic. High dielectric loss aluminum nitride ceramics, utilizing a yttria sintering aid and prepared with a fast cool after sintering according to the present invention had a brown color without the introduction of a colorant. Low dielectric loss aluminum nitride ceramics utilizing a yttria sintering aid, prepared with a slow cool after sintering according to the present invention, were substantially white to ivory in color.

A cooled, sintered aluminum nitride body exhibiting conventional or low dielectric loss can be converted to high dielectric loss according to the present invention by a post-sinter heat treatment followed by a fast cool to quench in a conventional nitrogen atmosphere, or a cool in a nitrogen deficient atmosphere (very low nitrogen partial pressure such as less than about 0.1%, or argon or other inert gas, or a vacuum) until quench temperature is reached. FIG.

3 demonstrates the effect of cooling rate after a 1750° C. heat treatment on dissipation factor of sintered aluminum nitride ceramic. A fast cool rate after heat treatment resulted in a higher dissipation factor, while a slow cool after heat treatment resulted in a low dissipation factor.

The hold time at the heat treatment temperature may be minimal for a heat treatment temperature greater than or equal to about 1750° C., as the equilibration of nitrogen between the atmosphere and the aluminum nitride body is rapid above that temperature. At lower temperatures the equilibration rate will be lower and a longer excursion at heat treatment temperatures might be required. The cool rate and atmosphere control the back diffusion of nitrogen and the elimination of the vacancies. The selective control of these factors provides the control of the dielectric loss of the ceramic.

Figure 4:
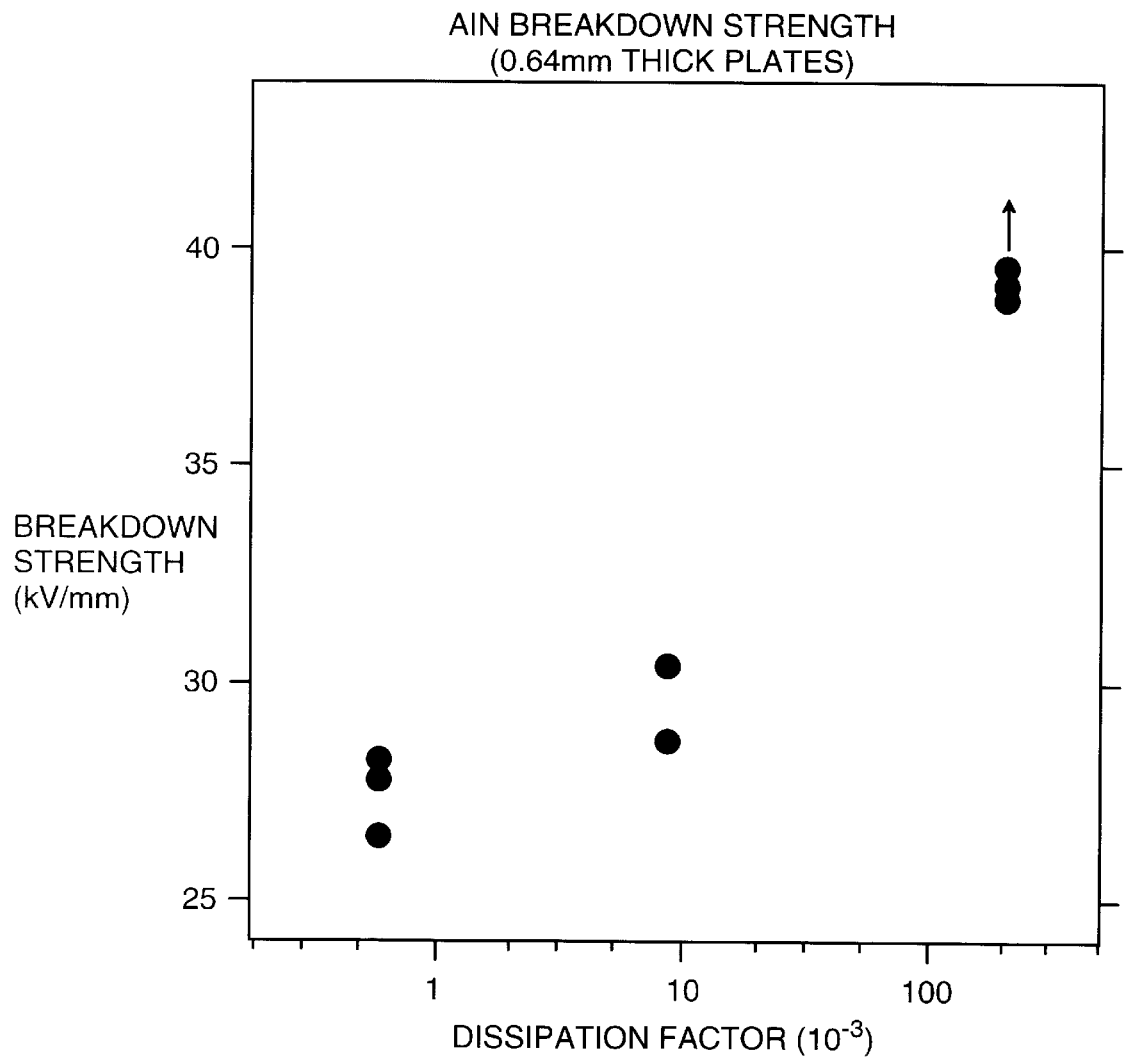
FIG. 4 is a graphical representation of the relationship between dissipation factor and breakdown strength of sintered aluminum nitride ceramic.

We have found that high dielectric loss aluminum nitride also exhibits an enhanced high dielectric strength and high breakdown voltage. For example, high dielectric loss sintered aluminum nitride about 0.025 inches (0.64 mm) thick, cooled in argon according to the present invention, exhibited a breakdown voltage of greater than 40 KV/mm, compared to less than 29 KV/mm for conventional to low loss dielectric aluminum nitride. This is advantageous, in that the higher the breakdown voltage or dielectric strength of a ceramic, the thinner that the ceramic can be made for a given application, saving on space, material, and weight. FIG. 4 demonstrates the relationship between dissipation factor and breakdown strength of sintered aluminum nitride ceramic. High dielectric loss, high dissipation factor aluminum nitride exhibited a higher breakdown strength than low dielectric loss, low dissipation factor aluminum nitride. Not all of the high loss parts could be broken down at the maximum available voltage so these points are annotated with an up arrow indicating that some are lower limits on the breakdown voltage.

An application at low frequency for low dielectric loss aluminum nitride sintered ceramic is for electrostatic chucks. Electrostatic chucks are useful in the semiconductor fabrication industry, for the processing of a semiconductor wafer. During processing, the wafer must be firmly held. Mechanical grips cover a part of the wafer, preventing that portion from being processed. Also, mechanical grips create debris that deteriorates the wafers.

Electrostatic grips, having embedded electrodes in an insulating material, can hold the silicon wafer while exposing an entire surface for processing. The aluminum nitride ceramic is inert in the wafer processing plasmas, which may contain ionic fluorine. The aluminum nitride further conducts heat of the process away from the wafer. However, if the dielectric loss of the aluminum nitride is conventional, or high, it will not function electrostatically at the electrostatic chuck operating temperature (400–500° C.) due to the low electrical resistivities of aluminum nitride at those temperatures. Resistivity of slow cooled aluminum nitride in this temperature range is at least a factor of 100 higher and therefore, the low dielectric loss aluminum nitride meets this requirement.

Examples of sintered aluminum nitride ceramic bodies according to the present invention, and methods of their preparation and testing are set forth below. These examples are representative of the invention, but it is not intended that the present invention be limited to these examples.

Dissipation Factor

Dielectric loss and dissipation factor can only be measured by applying a load, or voltage, to the material to be tested. Set forth below are electrode and pressure contact alternating current (AC) loss measurement procedures useful in their determination.

Techniques for measuring dielectric properties of electronic materials are described in ASTM Standard D150-92 "A-C Loss Characteristics and Permittivity (Dielectric Constant) of Solid Electrical Insulating Materials". Instruments used to measure capacitance and dissipation factor for the examples contained herein were General Radio (now QuadTech) 1621 Capacitance Measuring System, Andeen-Hagerling Model 2500A Capacitance Bridge, and Hewlett-Packard 4278A Capacitance Meter. These instruments were checked using standard capacitors and standard dielectric materials to verify their accuracy.

Standard D 150 (Sec. 6) recommends metal electrodes in intimate contact with a flat plate-like sample as generally the most accurate geometry to determine material dielectric properties. This method was used for the examples contained herein with sputtered gold or baked silver paint electrodes. As prescribed in the Standard, geometrical corrections were made to the measured capacitance data to determine material dielectric constant. No corrections are required for dissipation factor when the electrode diameter is smaller than the sample diameter and the measured data was used directly. These measurements and calculations were checked using standard dielectric materials NIST Standard Reference Material (SRM) 774 (Glass Dielectric) and single crystal sapphire.

Section 6.2.7 of D 150 states that spring loaded metal contacts can be used for dielectric measurements on smooth samples of adequate dielectric thickness. This pressure contact measurement technique was implemented by attaching $7/16$ inch diameter thin copper disk electrodes to the ends of cylindrical rods with thick foam tape. These rods were mounted in a fixture so that the copper disks were forced against the faces of the 0.5 inch diameter samples with a force of 3 lb. The flexibility of the copper and the resilience of the foam compensated for any slight non-parallelism in the sample faces.

Through the use of NIST SRM 774 samples, sapphire samples and aluminum nitride samples characterized using more accurate techniques, it was demonstrated that this pressure contact configuration was capable of measuring dissipation factor with an accuracy of approximately 0.0002 below 0.001 and about 10% above 0.001 at 1 kHz and 1 MHz. This technique is less capable of measuring dielectric constant with sufficient accuracy for some applications. However, since the pressure contact method was more convenient and its accuracy for dissipation factor was adequate, it was generally used for samples reported herein, except where dielectric constant was also of interest or for analyzing very low or very accurate values of dissipation factor. All data shown as a function of temperature in the Tables below, was taken with sputtered gold contacts.

Dielectric Strength

Dielectric strength is typically measured by clamping a ceramic plate between two disk shaped metal electrodes in an oil bath (to prevent air breakdown) and applying voltage at power line frequency (60 Hz) to the electrodes. The voltage is then ramped up at a fixed rate until electric field induced breakdown occurs, punching a hole through the sample and causing a high current flow. The measurement technique is described in ASTM D149-93a, Standard Test Method for Dielectric Breakdown Voltage and Dielectric Strength of Solid Insulating Materials at Commercial Power Frequencies.

Almost all applications for aluminum nitride sintered electronic package substrates require some minimal value of dielectric strength to prevent shorting between power and ground. However, most involve only low voltage power and the thicknesses required to provide adequate mechanical strength also provide adequate voltage breakdown values. In high voltage applications, however, such as hybrid power modules for motor controllers, and insulating disks which connect power semiconductors to heat sinks in modules which power electric trains, operating voltages currently reach 3000 volts rms. This requires breakdown voltages for the aluminum nitride substrate of over 10,000 volts rms. Current commercial aluminum nitride can meet this standard in thicknesses on the order of a millimeter, but higher voltages and/or requirements for thinner aluminum nitride substrates (for weight savings or higher thermal conductance) could result in parts failure due to voltage breakdown. Similar applications using alumina have been moving to thinner (about 0.25 mm) ceramic to improve thermal performance, for which voltage breakdown is an increasing concern. This is an area where large safety margins are desirable since failures can be catastrophic and dangerous.

We originally expected that the lowest dissipation factor aluminum nitride material would also have the highest dielectric strength, since the smaller current flow would minimize charge buildup (and thus electric field) at defects. However, as shown in FIG. 4, it was the highest dissipation factor material that had the highest dielectric strength. Without intending to be bound by theory, this may be due to the higher conductance preventing field buildup at defects by bleeding charge away. The samples tested were about 0.64 mm thick. For the material tested having the highest dissipation factor, the maximum voltage tested (25 kV) was not high enough to consistently break the parts down. Some of the points with the highest dissipation factor are therefore lower limits on breakdown strength, as indicated by the up-arrow in the graph.

Figure 6:
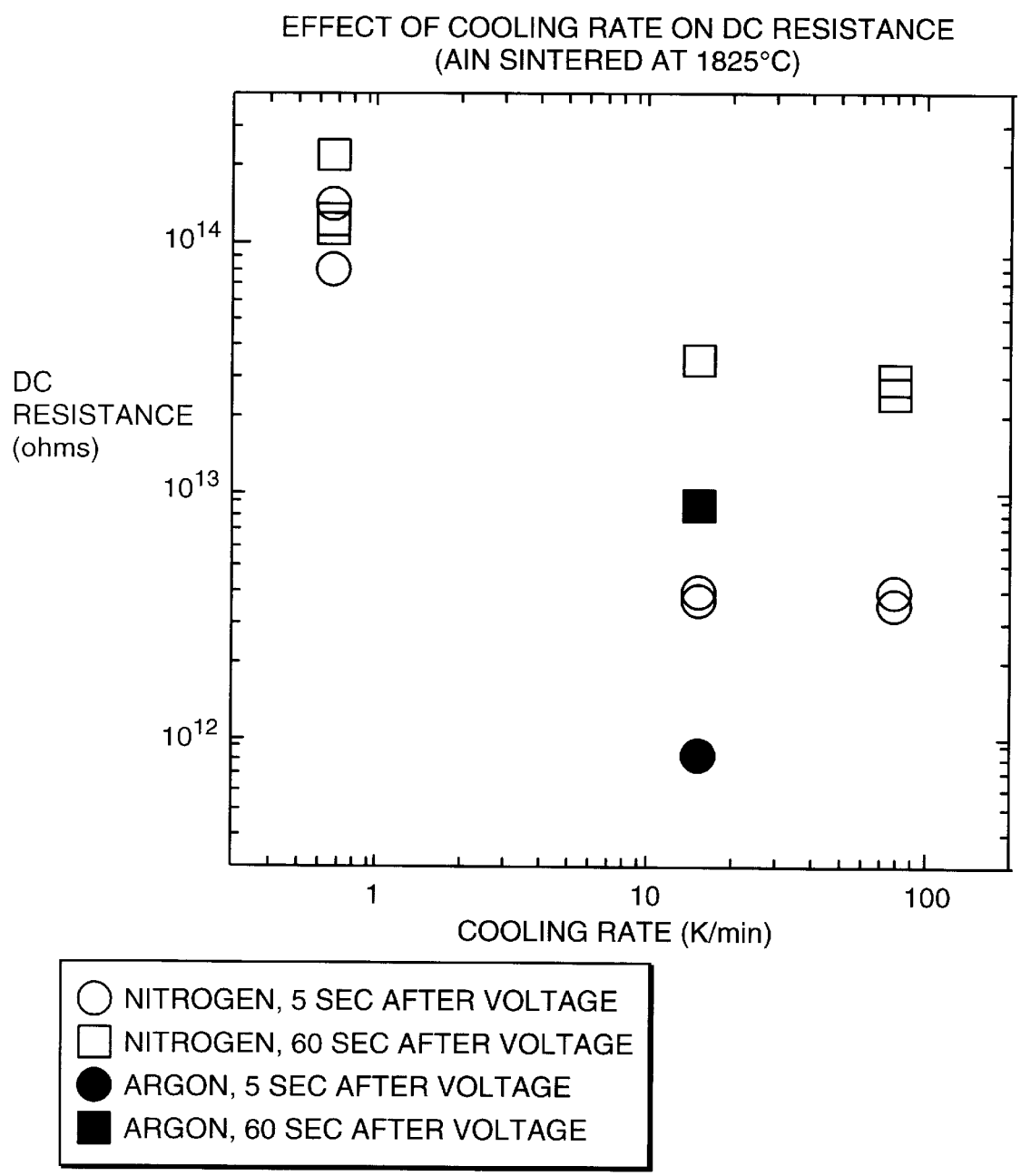
FIG. 6 is a graphical representation of the effect of cooling rate on the room temperature electrical resistance of aluminum nitride ceramic.

The high dissipation factor samples were heat treated in argon and fast cooled (Example 51, below). The intermediate samples were as received from standard aluminum nitride production, and the low loss samples were heat treated in nitrogen and slow cooled (Example 52, below). All samples were taken from the same two production runs. As discussed above, FIG. 2 shows the effect of nitrogen concentration on dissipation factor and FIG. 6 shows the effect of cooling rate and atmosphere on room temperature DC resistance. In FIG. 6, data represented for fast cool, slow cool and medium cool rates is taken from Examples 16, 17 and 22, respectively. Resistance measurements were taken by applying a voltage, and measuring the current after a set period of time, either 5 seconds or 60 seconds. Faster cool rates (and nitrogen deficient atmospheres) lower the DC resistance in aluminum nitride.

Measured dielectric strength of solid materials is normally dependent on sample thickness; the thinner the sample, the higher the dielectric strength. Frequently dielectric strength is inversely proportional to the square root of thickness. Test samples reported herein have been about 0.635 mm thick, but thinner samples are required to reliably cause breakdown with the maximum voltage of 25 kV.

The authors of Kasori et al. (J. Am. Ceram. Soc. 77 (8) 1991–2000 (1994)) do not report the sample thickness, but from their reported rate-of-rise of voltage, it can be assumed that they were less than 0.635 mm. It should be noted that dielectric breakdown is a statistical process and several samples are required to definitively describe breakdown strength. The average breakdown strength reported in the paper is approximately equal to the average breakdown strength of standard, 0.635 mm thick aluminum nitride substrate production samples.

However this voltage breakdown process is more properly described using Weibull statistics, where breakdown strength of parts is characterized by the electric field at which a small percentage (frequently 5%) of the parts are expected to fail and the Weibull modulus, which describes the width of the statistical distribution of breakdown fields. The Weibull modulus is the slope of the best fit line through the experimental breakdown field points on a Weibull plot. The higher the value of the Weibull modulus, the tighter the distribution of breakdown fields and the higher the product reliability for a given breakdown voltage design point. For the aluminum nitride parts described in the referenced paper, the Weibull modulus is seven and the breakdown field for five percent failure is about 18 kV/mm.

To determine the statistical properties of parts produced to have controlled dielectric loss, 24 slow cooled, low loss parts (runs equivalent to Example 52) and 11 fast cooled, high loss parts (runs equivalent to Example 51) were subjected to breakdown voltage tests. The thickness of these samples was 0.25 mm to allow breakdown at 25 kV or less. The results are displayed as Weibull plots in FIG. 7. The slow cool samples have a breakdown field (5% failure) of about 39 kV/mm with Weilbull modulus of 16, while the fast cool samples have breakdown field (5% failure) of about 53 kV/mm with Weibull modulus of 28. The fast cool, high dielectric loss samples have a substantial advantage in breakdown field and Weibull modulus, allowing thinner and/or more reliable devices to be constructed. Due to the higher Weibull modulus, this advantage would increase for high reliability applications, where allowable failure rates much lower than 5% would be required.

Other measurements indicated that near and above one megahertz and in the microwave region (12 GHz), the room temperature dissipation factor of the fast cooled and/or argon fired aluminum nitride is only slightly higher than that of the slow cooled material. At or below a few MHz there is a substantial difference in dissipation factor. The high "low frequency" dissipation factor of high dielectric strength aluminum nitride may be a problem in some applications, but in most cases it should not be a problem. The rapidly cooled material has lower DC resistivity, but the value (about $10^{14}$ ohms·cm) is high enough for most electronic packaging applications. At microwave frequencies (about 12.6 Ghz) the high loss samples are a factor of about 1.7 times higher in dissipation factor than the low loss samples, as shown in Table II (Example 54).

Applications

High dissipation factor aluminum nitride sintered bodies may be used in a multilayer ceramic which contains only ground and power planes. Signal lines could be contained in polymer layers deposited on top of the ceramic. (This sort of ceramic/polymer configuration without high loss material is in use.) The lossy, high dielectric constant, dielectric would absorb voltage fluctuations in the supplied power, reducing noise seen by the integrated circuits. For these high power electronic applications, the ceramic operating temperature typically will reach 100–200° C. In this region, the high loss aluminum nitride will have dielectric constant 10 to 30 times and loss index 10 to 100 times that of conventional to low loss aluminum nitride. For this application it would be best if the high loss extended to high frequencies, but exemplified characteristics may be suitable, depending on the details of the application.

Low dissipation factor material may be used in a low frequency, high precision hybrid amplifier where the frequency dependent attenuation caused by higher loss material might produce unacceptable distortion. Examples include a high power circuit, but even a low power circuit operating over a wide temperature range might use aluminum nitride to achieve thermal expansion match.

High dielectric constant and/or high dielectric loss material, in graded or non-graded configurations, can be used in high voltage applications to reduce AC corona and reduce voltage gradients.

EMBODIMENTS OF THE INVENTION

Example 1

Figure 5:
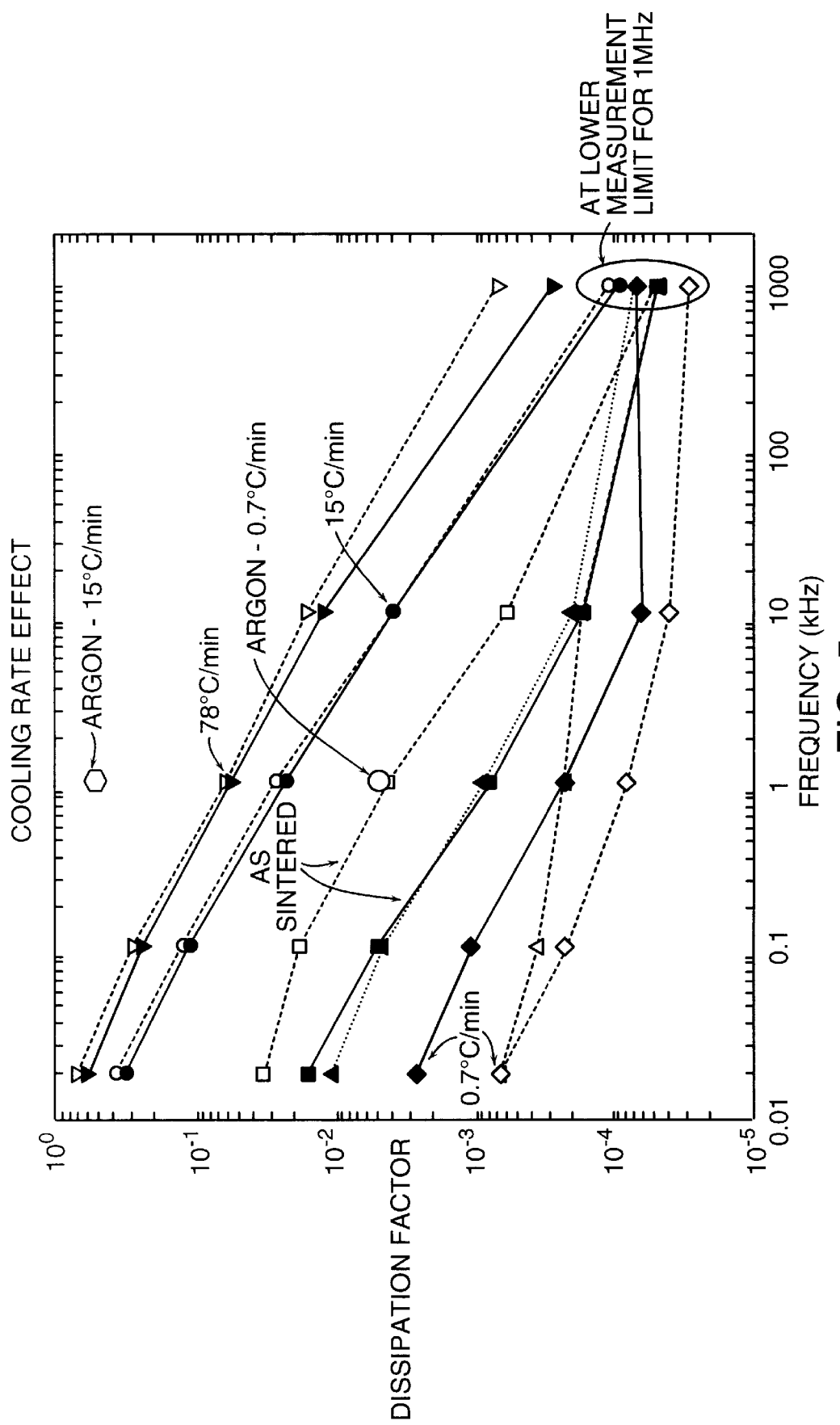
FIG. 5 is a graphical representation of the effect of cooling rate and cooling atmosphere on the dissipation factor of sintered aluminum nitride ceramic measured at various frequencies.

The dielectric behavior of conventional aluminum nitride ceramic was modified through an anneal step followed by a controlled cooling cycle. The conventional aluminum nitride ceramic samples were prepared by adding 5 wt % yttrium oxide (H. Stark) to aluminum nitride powder (Tokuyama Soda) with appropriate binders. This powder was then spray dried and dry pressed to form a green body, and this green body was then burned out in air at 600° C. and sintered in nitrogen at 1825° C. for 4 hours in a graphite furnace. The conventional aluminum nitride sample produced had a dielectric loss of between 0.001 and about 0.01, a thermal conductivity of about 175 W/m-K and the characteristic light tan color associated with aluminum nitride ceramics. To lower the dielectric loss of this sample by decreasing the population of nitrogen vacancies, this sample was heated up to a temperature of 1850° C. in a graphite furnace and then cooled at a rate of 0.7° C./min. The slow cooling of this sample allowed the population of nitrogen vacancies to disappear during the cool down process. The dissipation factor of the resulting aluminum nitride sintered body was below 0.001 at 1 KHz and the final sample appeared white. The dissipation factor over a wide range of frequencies for samples prepared using this method is shown in FIG. 5.

Figure 7:
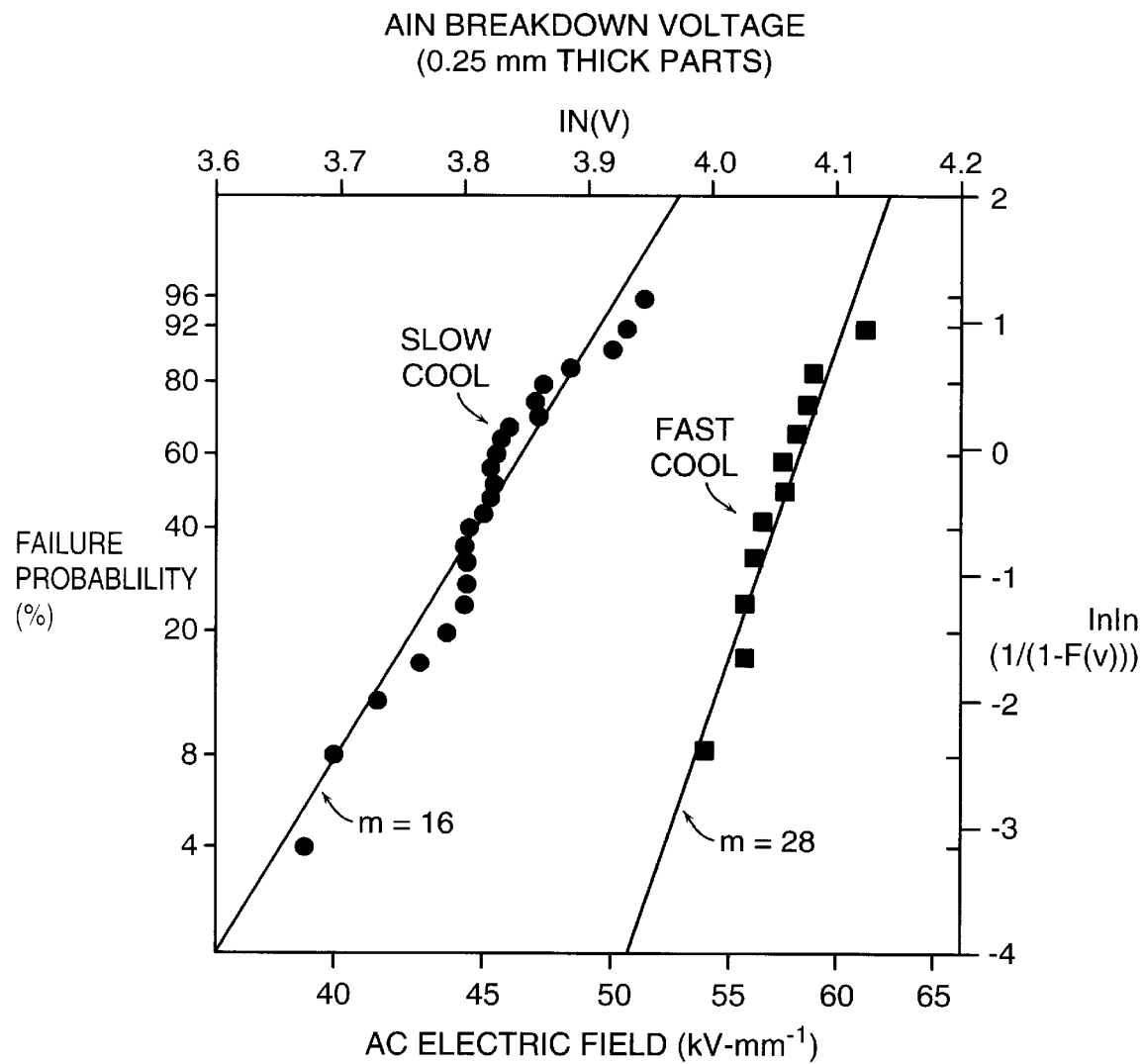
FIG. 7 is a Weibull plot of the statistical effect of cooling rate on the electrical breakdown strength of aluminum nitride ceramic, the Weibull modulus shown for each curve.
Figure 8:
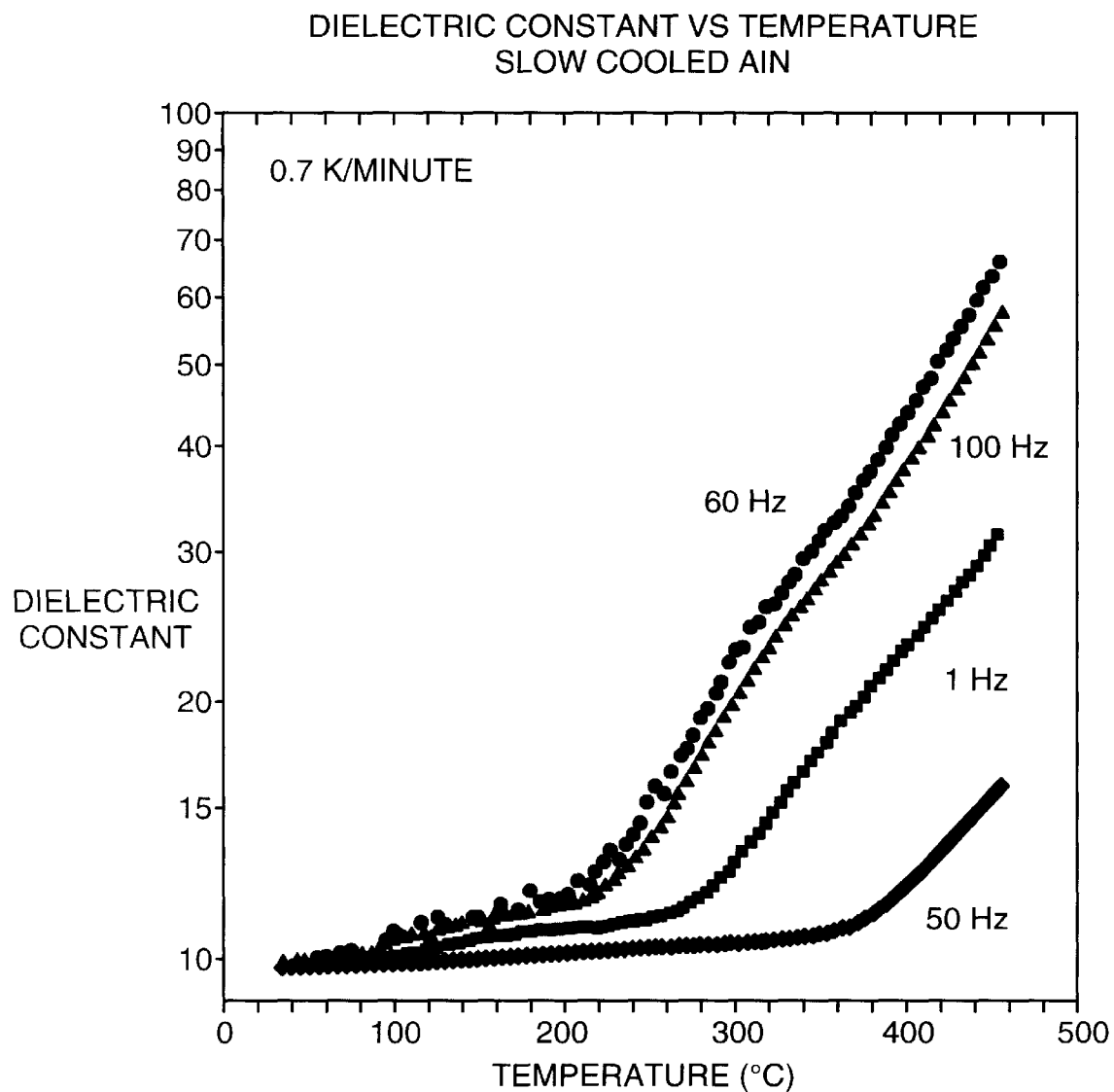
FIG. 8 is a graphical representation of the temperature dependence of dielectric constant at four frequencies for slow cooled aluminum nitride ceramic.
Figure 9:
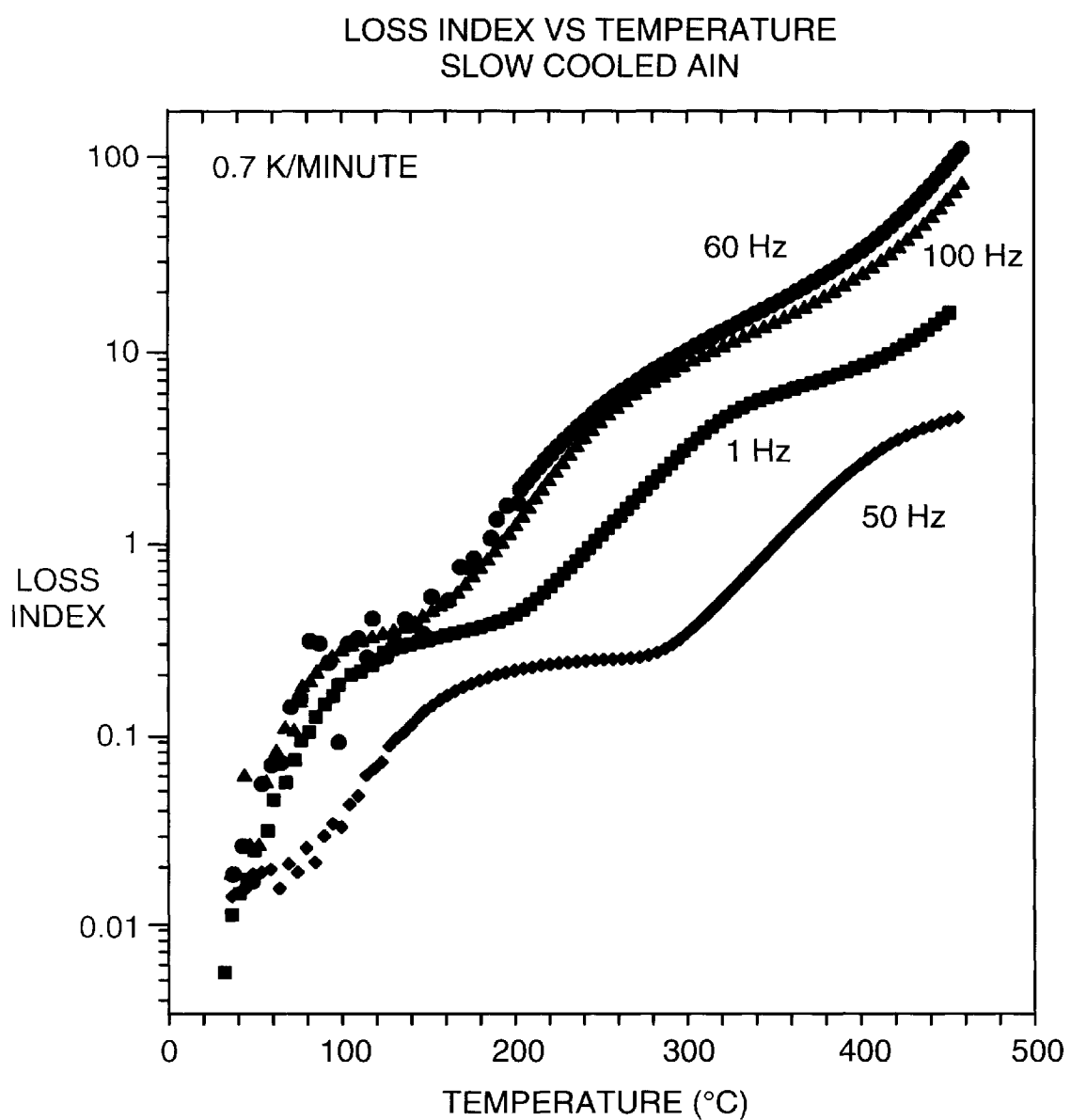
FIG. 9 is a graphical representation of the temperature dependence of loss index at four frequencies for slow cooled aluminum nitride ceramic.
Figure 10:
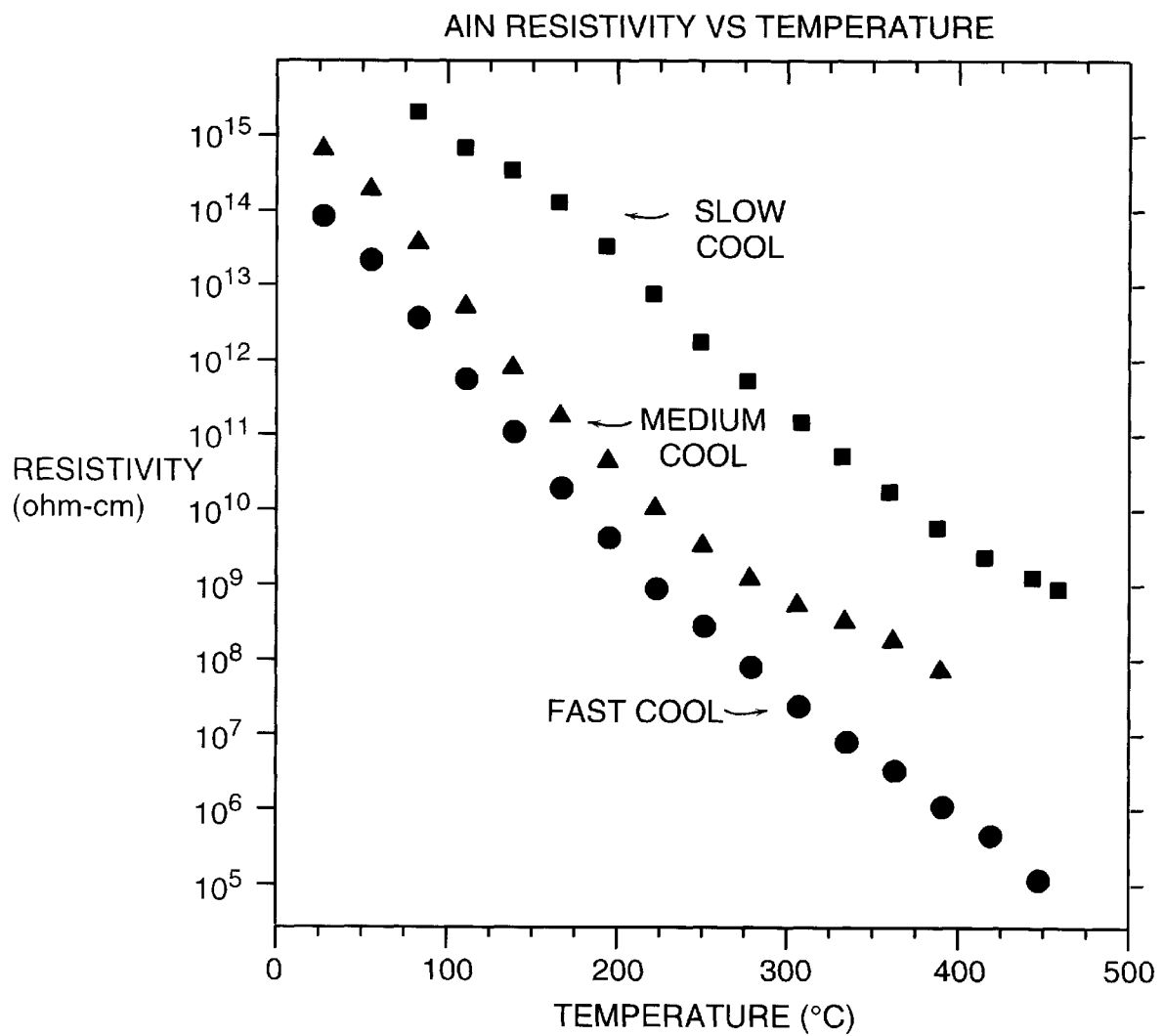
FIG. 10 is a graphical representation of the effect of cooling rate on the temperature dependence of the DC resistivity of aluminum nitride ceramic.

The dielectric constant measured at four frequencies as a function of ambient temperature for samples prepared using this method is shown in FIG. 8. (Fringing corrections were not made, so displayed values are 10 to 15% too large.) The loss index for four frequencies as a function of ambient temperature for samples prepared using this method is shown in FIG. 9. The DC resistivity as a function of ambient temperature for samples prepared using this method is shown in FIG. 10. The dielectric strength characteristics of samples prepared using this method as discussed above, are shown in FIG. 7.

Example 2

A sample was prepared according to the procedure of Example 1, except that cooling from the anneal temperature was at 15° C./min. The rapid cooling of this sample trapped in a large population of nitrogen vacancies. The dielectric loss of the resulting aluminum nitride sintered body at 1 KHz was above 0.01 and the sample had a dark tan appearance. The dielectric loss for samples prepared using this method is shown for a range of frequencies in FIG. 5.

Example 3

A sample was prepared according to the procedure of Example 1, except that cooling from the anneal temperature was at 78° C./min. The dielectric loss of the resulting aluminum nitride sintered body at 1 KHz was above 0.01 and the sample had a dark tan appearance. The dielectric loss for samples prepared using this method is shown for a range of frequencies in FIG. 5.

Example 4

A conventional aluminum nitride ceramic sample, with dielectric loss of between 0.001 and 0.01 and a light tan color was annealed at 1850° C. for 4 hours in argon gas and then was cooled at 15° C./min. in argon gas. The low partial pressure of nitrogen gas in the argon gas atmosphere caused nitrogen to leave the aluminum nitride sample at the sintering temperature, resulting in a large population of nitrogen vacancies. This produced a sample which was dark brown and had a dissipation factor of 0.5.

Figure 11:
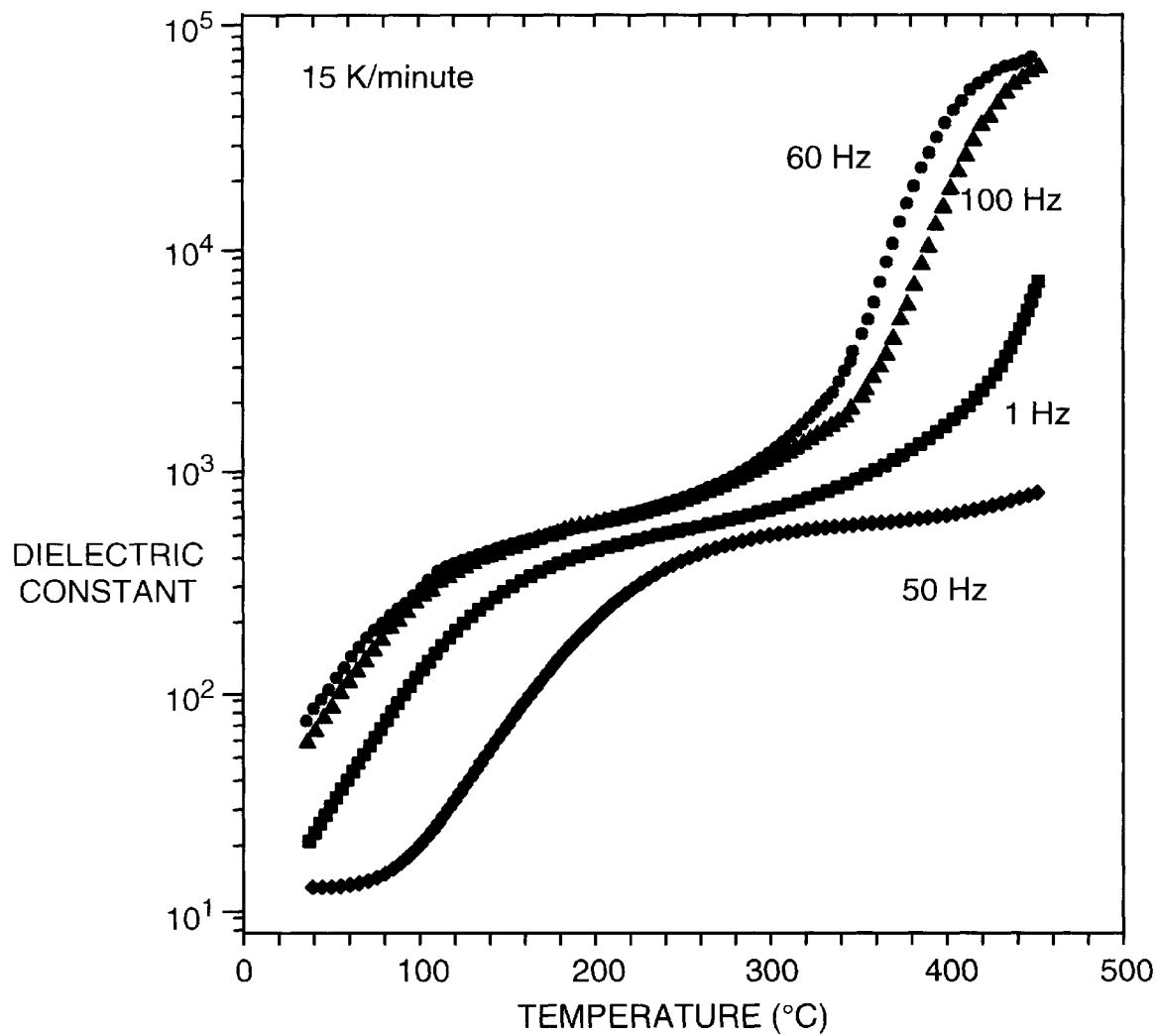
FIG. 11 is a graphical representation of the temperature dependence of dielectric constant at four frequencies for fast cooled aluminum nitride ceramic.
Figure 12:
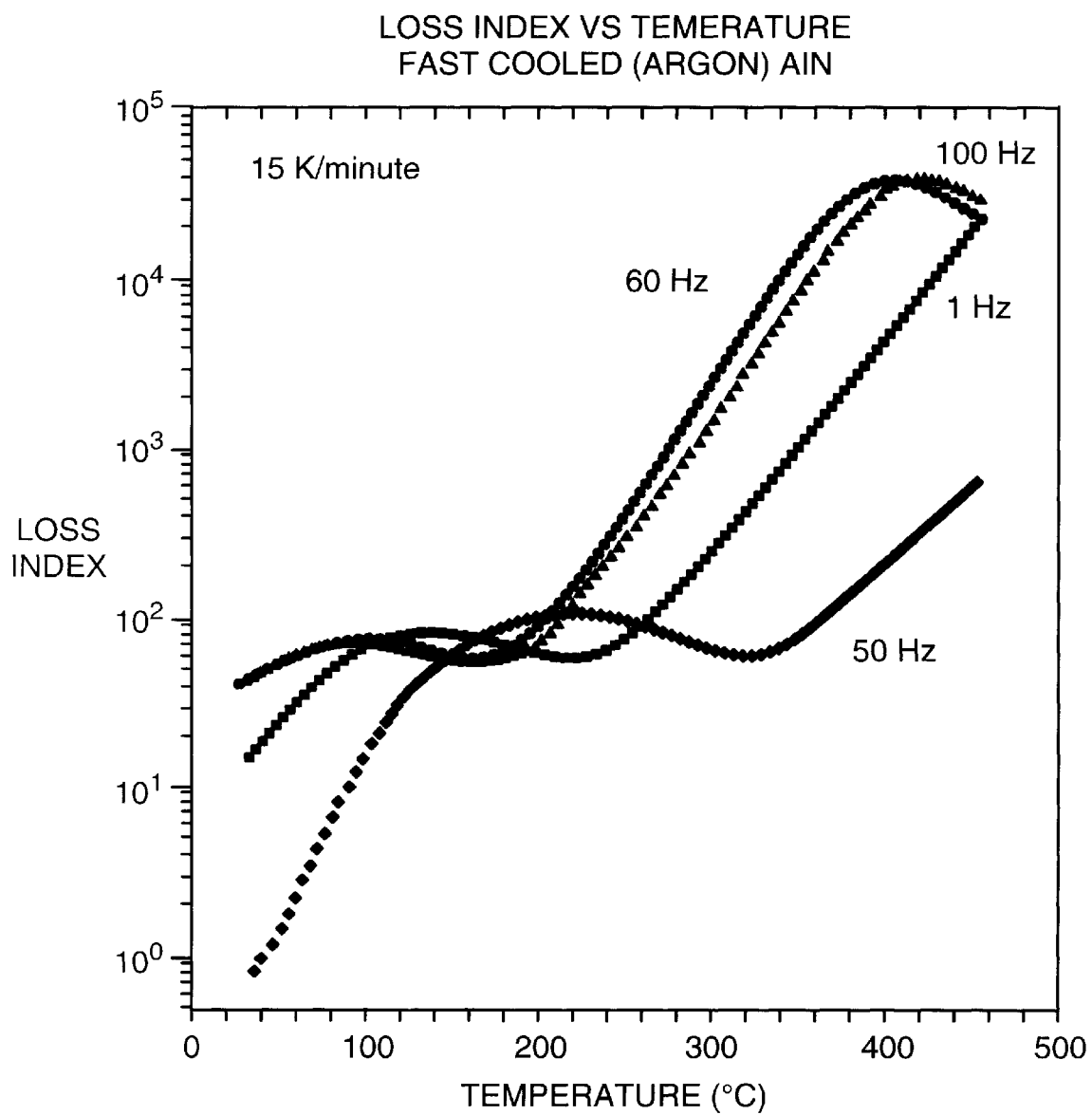
FIG. 12 is a graphical representation of the temperature dependence of loss index at four frequencies for fast cooled aluminum nitride ceramic.

The dielectric constant for four frequencies as a function of ambient temperature for samples prepared using this method is shown in FIG. 11. (Fringing corrections were not made, so displayed values are 10 to 15% too large.) The loss index for four frequencies as a function of ambient temperature for samples prepared using this method is shown in FIG. 12. The DC resistivity as a function of ambient temperature for samples prepared using this method is shown in FIG. 10. The dielectric strength characteristics of samples prepared using this method are shown in FIG. 7.

Example 5

A green body prepared as in Example 1 was burned out and sintered according to the procedure described in Example 1, except that at the end of the sintering period at 1825° C., the sample was cooled to 850° C. at a rate of 0.7° C./minute. Upon reaching 850° C., the furnace was turned off, and the resulting aluminum nitride sintered body was white in color and had a dissipation factor of less than 0.0002.

Examples 6–56

Controlled dielectric loss sintered aluminum nitride ceramic bodies were prepared according to the present invention by controlling the cooling rate and/or cooling atmosphere either immediately following sintering, or after a post-sinter heat treatment (or "refire"). Tables I and II set forth the timing of the treatment, following sintering (SINT) or refire (REF), the sintering or refire temperature, time, atmosphere, cooling rate in K/minute, the temperatures in ° C. at which cooling control began and ended, the resulting dissipation factor (DF) as measured by pressure contact or electrode techniques at 1 KHz, the thermal conductivity in W/mK, and the color of the resulting ceramic. Table II additionally sets forth the X-band Dielectric Constant and Dissipation Factor, measured at about 12 GHz frequency.

It is therefore demonstrated that the objects of the present invention are met by the examples as set forth above. The present invention is not to be limited by those examples however, which are provided merely to demonstrate the invention, but are to include all embodiments defined by the following claims and their equivalent embodiments.

TABLE I

| EX. NO. | REF* SINT. | REF SN TEMP. | TIME-HRS | % N₂ | % H₂ | % Ar | COOL RATE | COOL START | COOL STOP | 1 KHz DF (pr. cont) (× 0.001) | THERMAL COND. | COLOR |
|---|---|---|---|---|---|---|---|---|---|---|---|---|
| 6 | REF | 1750 | 64 | 100 | | | 15.0 | 1750 | 1500 | 19.3 | 207 | TAN |
| 7 | REF | 1750 | 16 | 100 | | | 15.0 | 1750 | 1500 | 28.0 | 192 | TAN |
| 8 | REF | 1750 | 4 | 100 | | | 15.0 | 1750 | 1500 | 24.0 | 183 | TAN |
| 9 | REF | 1825 | 16 | 100 | | | 15.0 | 1825 | 1500 | 37.8 | 199 | DK TAN |
| 10 | REF | 1750 | MIN | 100 | | | 15.0 | 1750 | 1500 | 18.5 | 176 | LT TAN |
| 11 | REF | 1750 | 16 | 100 | | | 2.0 | 1750 | 1500 | 3.0 | 193 | VLT TAN |
| 12 | REF | 1750 | 15 | 100 | | | 78.0 | 1750 | 1500 | 58.0 | 193 | |
| 13 | REF | 1850 | 4 | 100 | | | 0.7 | 1850 | 850 | 0.1 | 194 | LT GREY |
| 14 | REF | 1850 | 4 | 100 | | | 30.0 | 1850 | 1500 | 27.0 | 187 | TAN |
| 15 | REF | 1850 | 4 | 100 | | | 0.4 | 1850 | 850 | 0.2 | 201 | OFF WHITE |
| 16 | REF | 1850 | 4 | 0 | | 100 | 15.0 | 1850 | 199 | 510.0 | 187 | DK OLIVE BROWN |
| 17 | SINT | 1825 | 4 | 100 | | | 0.7 | 1825 | 850 | 0.0 | 187 | DK WHT |
| 18 | REF | 1825 | 4 | 100 | | | 2.0 | 1825 | 850 | 0.2 | 194 | LT GREY |
| 19ᵃ | SINT | 1825 | 4 | 100 | | | 0.7 | 1825 | 1500 | 0.1 | 185 | LT GREY |
| 20ᵇ | SINT | 1825 | 4 | 100 | | | 0.07 | 1825 | 1200 | 0.0 | 189 | LT GREY |
| 21ᶜ | SINT | 1825 | 4 | 100 | | | 5.0 | 1825 | 1200 | 5.7 | 185 | VLT TAN |
| 22ᵈ | SINT | 1825 | 4 | 100 | | | 5.0 | 1825 | 850 | 9.0 | 185 | VLT TAN |
| 23 | SINT | 1825 | 4 | 100 | | | 2.0 | 1825 | 1200 | 4.3 | 185 | VLT TAN |
| 24 | SINT | 1825 | 4 | 100 | | | 2.0 | 1825 | 1500 | 4.6 | 187 | YLW-TAN |
| 25 | SINT | 1825 | 4 | 1 | | 99 | 0.7 | 1825 | 1000 | 0.2 | 180 | IVORY |
| 26 | SINT | 1825 | 4 | 84 | 16 | | 0.8 | 1825 | 1000 | 1.8 | 190 | WHITE |
| 27 | REF | 1825 | 4 | 100 | | | 0.7 | 1825 | 1500 | 2.0 | | LT TAN |
| 28 | REF | 1850 | 4 | 100 | | | 0.7 | 1850 | 1500 | 2.0 | 195 | LT YLW |
| 29 | SINT | 1825 | 4 | 70 | 30 | | 0.8 | 1825 | 1000 | 1.5 | 186 | WHITE |
| 30 | REF | 1825 | 4 | 95 | 5 | | 0.8 | 1825 | 1000 | 1.5 | 200 | LT TAN |
| 31 | SINT | 1825 | 4 | 95 | 5 | | 0.8 | 1825 | 1000 | 5.0 | 191 | GREY |
| 32 | REF | 1825 | 4 | 100 | | | 0.7 | 1825 | 1000 | 0.0 | 203 | DK WHT |
| 33 | REF | 1825 | 4 | 100 | | | 0.7 | 1825 | 1000 | 0.0 | 203 | DK WHT |
| 34 | REF | 1825 | 4 | 100 | | | 0.7 | 1825 | 1000 | 0.0 | 204 | DK WHT |
| 35 | SINT | 1825 | 4 | 100 | | | 0.7 | 1825 | 1600 | 4.6 | 194 | DK TAN |
| 36 | SINT | 1825 | 4 | 85 | 15 | | 0.8 | 1825 | 1250 | 0.3 | 189 | VLT GRY |
| 37 | REF | 1825 | 4 | 85 | 15 | | 0.8 | 1825 | 1250 | 0.9 | 197 | IVORY |
| 38 | SINT | 1825 | 4 | 85 | 15 | | 0.8 | 1825 | 1400 | 1.0 | 189 | VLT GRY |
| 39 | REF | 1825 | 4 | 85 | 15 | | 0.8 | 1825 | 1400 | 1.5 | 198 | VLT TAN |
| 40 | SINT | 1825 | 4 | 100 | | | 0.7 | 1825 | 1350 | 0.3 | 193 | VLT YLW |
| 41 | REF | 1825 | 4 | 100 | | | 0.7 | 1825 | 1350 | 0.0 | 202 | IVORY |
| 42 | SINT | 1825 | 4 | 100 | | | 30.0 | 1825 | 1000 | 11.6 | 182 | DK TAN |
| 43 | REF | 1825 | 4 | 100 | | | 30.0 | 1825 | 1000 | 27.0 | 192 | DK TAN |
| 44 | SINT | 1825 | 4 | 100 | | | 0.7 | 1650 | 1200 | 0.8 | 188 | IVORY |
| 45 | REF | 1825 | 4 | 100 | | | 0.7 | 1650 | 1200 | 1.2 | 195 | IVORY |
| 46 | SINT | 1700 | 4 | 100 | | | 0.7 | 1825 | 1000 | 0.6 | 116 | GREY |
| 47 | SINT | 1825 | 4 | 85 | 15 | | 30.0 | 1825 | 199 | 16.0 | 179 | TAN |
| 48 | SINT | 1825 | 4 | 0.1 | | 99.9 | 15.0 | 1825 | 800 | 13.0 | 178 | DK TAN |
| 49 | SINT | 1825 | 4 | 0 | | 100 | 0.7 | 1825 | 1000 | 5.0 | 182 | DK TAN |
| 50 | REF | 1650 | 16 | 100 | | | 0.7 | 1650 | 1000 | 1.0 | 191 | DK CRM |
| 51 | REF | 1750 | 8 | 0 | | 100 | 15.0 | 1750 | 199 | 215.0 | 193 | BROWN |
| 52 | REF | 1750 | 4 | 100 | | | 0.7 | 1750 | 1000 | 0.6 | 190 | LT CRM |

ᵃ 1 KHz DF (electrode = 0.2 × (0.001)
ᵇ 1 KHz DF (electrode = 0.1 × (0.001)
ᶜ 1 KHz DF (electrode = 5.4 × (0.001)
ᵈ 1 KHz DF (electrode = 10.0 × (0.001)
CRM = Cream
DK = Dark
LT = Light
VLT = Very Light
YLW = Yellow
WHT = White

TABLE II

| EX. NO. | REF/SINT. | REF/SN/ TEMP | TIME-HRS | % N₂ | % H₂ | % Ar | COOL RATE | COOL START | COOL STOP | 1 KHz DF (pr. count) (× 0.001) | THRML COND. | COLOR | X-BAND DIELECTRIC CONSTANT |
|---|---|---|---|---|---|---|---|---|---|---|---|---|---|
| 53 | REF | 1750 | 4 | 85 | 15 | | 78.0 | 1750 | 800 | 52.0 | 182 | DK YLW TAN | 8.58 |
| 54 | REF | 1750 | 4 | 0 | | 100 | 15.0 | 1750 | 1000 | 227.0 | 179 | BROWN | 8.59 |
| 55 | REF | 1750 | 16 | 85 | 15 | | 78.0 | 1750 | 1000 | 55.0 | 191 | DK YLW TAN | 8.56 |
| 56 | REF | 1750 | 4 | 100 | | | 0.7 | 1750 | 1000 | 0.3 | 188 | WHITE | 8.57 |

TABLE II-continued

| EX. NO. | X-BAND DF (x 0.001) | FREQUENCY GHz |
|---|---|---|
| 53 | 2.5 | 12.6 |
| 54 | 4.2 | 12.6 |
| 55 | 2.4 | 12.6 |
| 56 | 2.5 | 12.6 |

We claim:

1. A process for making a high purity aluminum nitride electrostatic chuck, comprising the steps of:
    a) providing a sintered body comprising polycrystalline aluminum nitride having an electrode embedded therein, said body being at a temperature of greater than about 850° C., and
    b) cooling the sintered body in a nitrogen-deficient atmosphere to cause transport of nitrogen out of the polycrystalline aluminum nitride and to effect a selected nitrogen vacancy population in the polycrystalline aluminum nitride.

2. The process of claim 1 wherein the sintered body further comprises yttria.

3. The process of claim 1 wherein the sintered body is obtained by sintering a raw AlN powder produced by carbothermal reduction.

4. The process of claim 1 wherein the cooling rate of step b) is carried out at a rate of at least 5° C./minute.

5. The process of claim 1 wherein the nitrogen-deficient atmosphere comprises no more than 0.1% nitrogen.

6. The process of claim 1 wherein the nitrogen-deficient atmosphere consists essentially of argon.

7. The process of claim 1 wherein step a) comprises the step of sintering a raw AlN powder at a sintering temperature to produce the sintered body, and the temperature at which cooling of the sintered body begins in step b) is the temperature of the sintering step.

8. The process of claim 1 wherein step a) comprises:
    i) providing an already sintered body having a first nitrogen vacancy population, the body being at a first temperature which is insufficient to produce transport of nitrogen out of the polycrystalline aluminum nitride, followed by,
    ii) raising the temperature of the sintered body to a temperature sufficient to produce transport of nitrogen out of the polycrystalline aluminum nitride, and wherein
the cooling in step b) produces a sintered body having a second nitrogen vacancy population which is larger than the first nitrogen vacancy population.

9. The process of claim 1 wherein the sintered body consists essentially of polycrystalline aluminum nitride.

10. A process for making a high purity aluminum nitride electrostatic chuck, comprising the steps of:
    a) providing a mixture comprising:
        i) a raw powder comprising aluminum nitride, and
        ii) an electrode embedded in the raw powder,
    b) sintering the mixture to produce a polycrystalline sintered aluminum nitride body having an electrode embedded therein, and
    c) cooling the sintered body in a nitrogen deficient atmosphere to cause transport of nitrogen out of the polycrystalline aluminum nitride and to effect a selected nitrogen vacancy population in the polycrystalline aluminum nitride.

* * * * *